United States Patent
Lee et al.

(10) Patent No.: US 10,825,527 B2
(45) Date of Patent: Nov. 3, 2020

(54) MEMORY DEVICE AND OPERATING METHOD OF THE MEMORY DEVICE

(71) Applicant: SK hynix Inc., Icheon-si Gyeonggi-do (KR)

(72) Inventors: Sang Min Lee, Seoul (KR); Heung Yeul Lee, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/502,221

(22) Filed: Jul. 3, 2019

(65) Prior Publication Data

US 2020/0168279 A1 May 28, 2020

(30) Foreign Application Priority Data

Nov. 23, 2018 (KR) .................. 10-2018-0146803

(51) Int. Cl.
*G11C 16/10* (2006.01)
*G11C 16/08* (2006.01)
*G11C 16/24* (2006.01)
*G11C 16/34* (2006.01)
*H01L 27/115* (2017.01)

(52) U.S. Cl.
CPC .............. *G11C 16/10* (2013.01); *G11C 16/08* (2013.01); *G11C 16/24* (2013.01); *G11C 16/3459* (2013.01); *H01L 27/115* (2013.01)

(58) Field of Classification Search
CPC ..... G11C 16/10; G11C 16/24; G11C 16/3459; G11C 16/08; H01L 27/115
See application file for complete search history.

(56) References Cited

U.S. PATENT DOCUMENTS

| | | | |
|---|---|---|---|
| 8,822,322 B2* | 9/2014 | Lee .......... | H01L 27/11578 |
| | | | 257/E21.645 |
| 9,559,112 B2* | 1/2017 | Lee .......... | H01L 27/11578 |
| 9,589,979 B2* | 3/2017 | Hong .......... | H01L 29/4234 |
| 2017/0076802 A1 | 3/2017 | Mokhlesi | |
| 2020/0058669 A1* | 2/2020 | Chen .......... | H01L 27/11573 |

FOREIGN PATENT DOCUMENTS

KR 1020150110945 A 10/2015

* cited by examiner

*Primary Examiner* — Gene N Auduong
(74) *Attorney, Agent, or Firm* — William Park & Associates Ltd.

(57) ABSTRACT

There are provided a memory device and an operating method thereof. While memory cells connected to a selected word line are being programmed, the memory device applies bit line voltages set to be different from each other depending on separation distances of channel structures from an edge of the selected word line to bit lines connected to the channel structures.

21 Claims, 15 Drawing Sheets

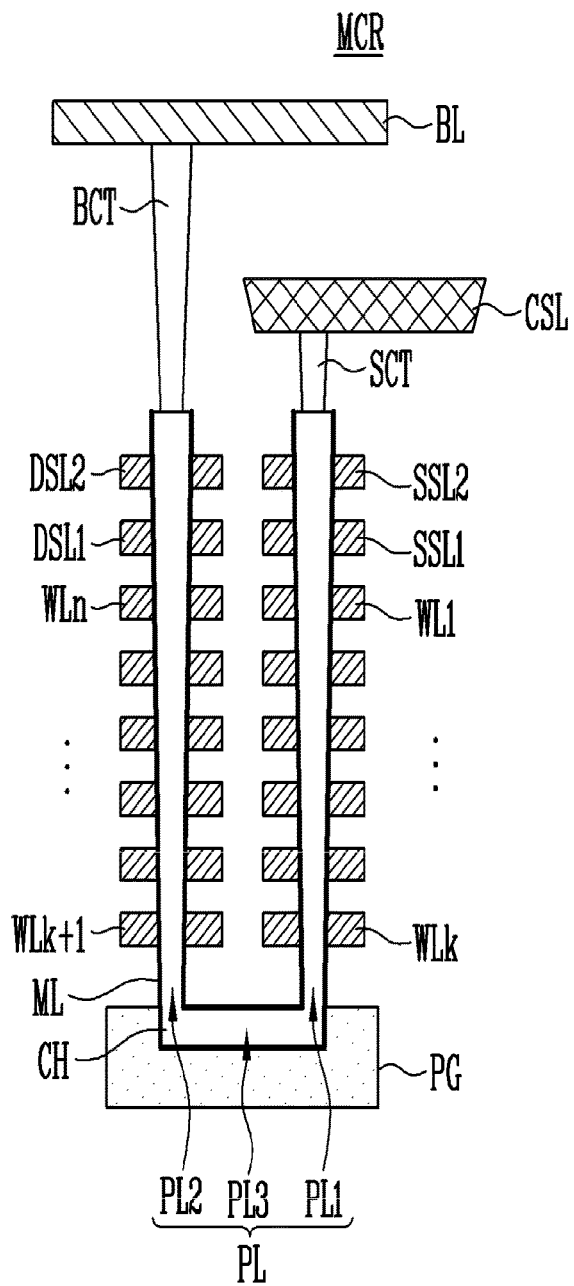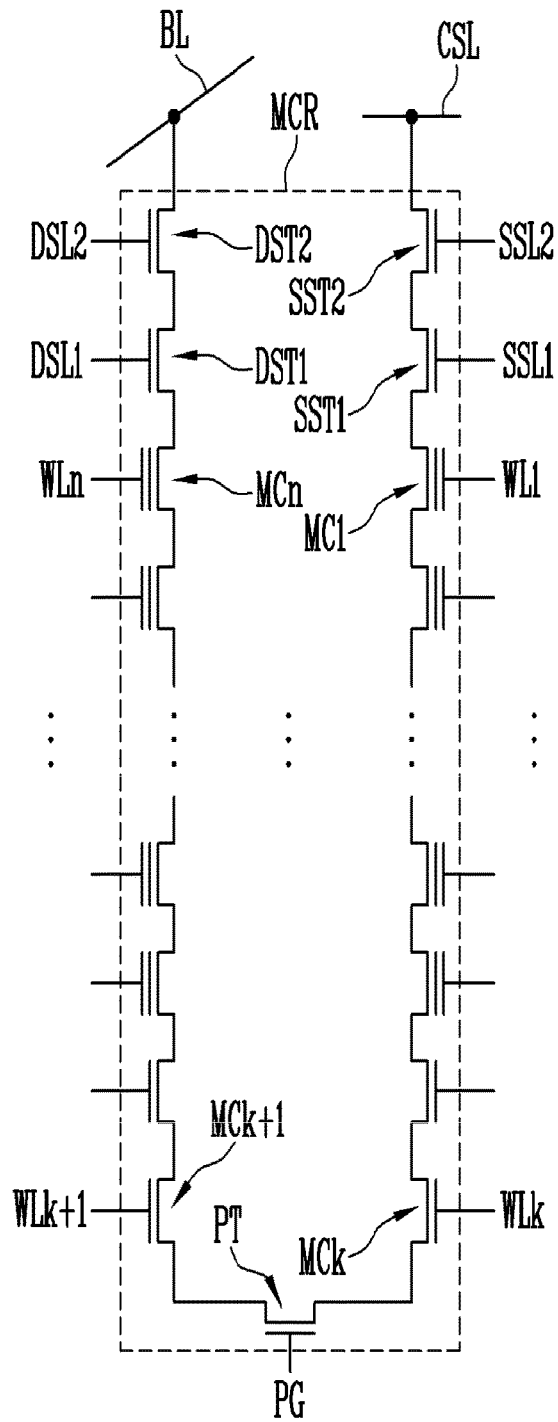

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2018-0146803, filed on Nov. 23, 2018, the entire disclosure of which is incorporated herein by reference in its entirety.

BACKGROUND

1. Technical Field

The present disclosure generally relates to a memory device, and more particularly, to a three-dimensional memory device and an operating method of the memory device.

2. Related Art

An electronic device such as a computer, a digital camera or a smart phone processes data, using a memory system. The memory system may include a memory device for storing data and a controller for controlling the memory device.

The memory device may be classified into a volatile memory device and a nonvolatile memory device. The nonvolatile memory device is a memory device that retains stored data even when the supply of power is interrupted.

The nonvolatile memory device may include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

As high capacity and miniaturization of the nonvolatile memory device are required, a three-dimensional memory device has been proposed. The three-dimensional memory device includes channel structures protruding on a substrate and memory cells that are connected to the channel structures and are three-dimensionally arranged.

SUMMARY

According to an aspect of the present disclosure, there is provided a method for operating a memory device. The method may include: programming memory cells connected to a selected word line among word lines that are stacked to be spaced apart from each other and are penetrated by channel structures, wherein, while the memory cells connected to the selected word line are being programmed, bit line voltages set to be different from each other depending on separation distances of the channel structures from an edge of the selected word line are applied to bit lines connected to the channel structures.

According to another aspect of the present disclosure, there is provided a method for operating a memory device. The method may include: performing a pre-program loop such that memory cells connected to a selected word line among word lines that are stacked to be spaced apart from each other and are penetrated by channel structures have threshold voltages higher than a pre-verify voltage; and performing a main program loop such that pre-programmed cells having threshold voltages higher than the pre-verify voltage among the memory cells have threshold voltages higher than a main verify voltage, wherein, while at least one of the pre-program loop and the main program loop is being performed, bit line voltages set to be different from each other depending on separation distances of the channel structures from an edge of the selected word line are applied to bit lines connected to the channel structures.

According to another aspect of the present disclosure, there is provided a memory device. The memory device may include: a memory cell array including word lines that are stacked to be spaced apart from each other and are penetrated by channel structures, memory cells connected to the word lines, and bit lines connected to the channel structures; and a peripheral circuit configured to set bit line voltages applied to the bit lines when a program operation is performed on the memory cell array to be different from each other depending on separation distances of the channel structures from edges of the word lines.

BRIEF DESCRIPTION OF THE DRAWINGS

FIGS. 5A to 5C are diagrams illustrating an embodiment of the memory cell array shown in FIG. 3.

DETAILED DESCRIPTION

Figure 1:
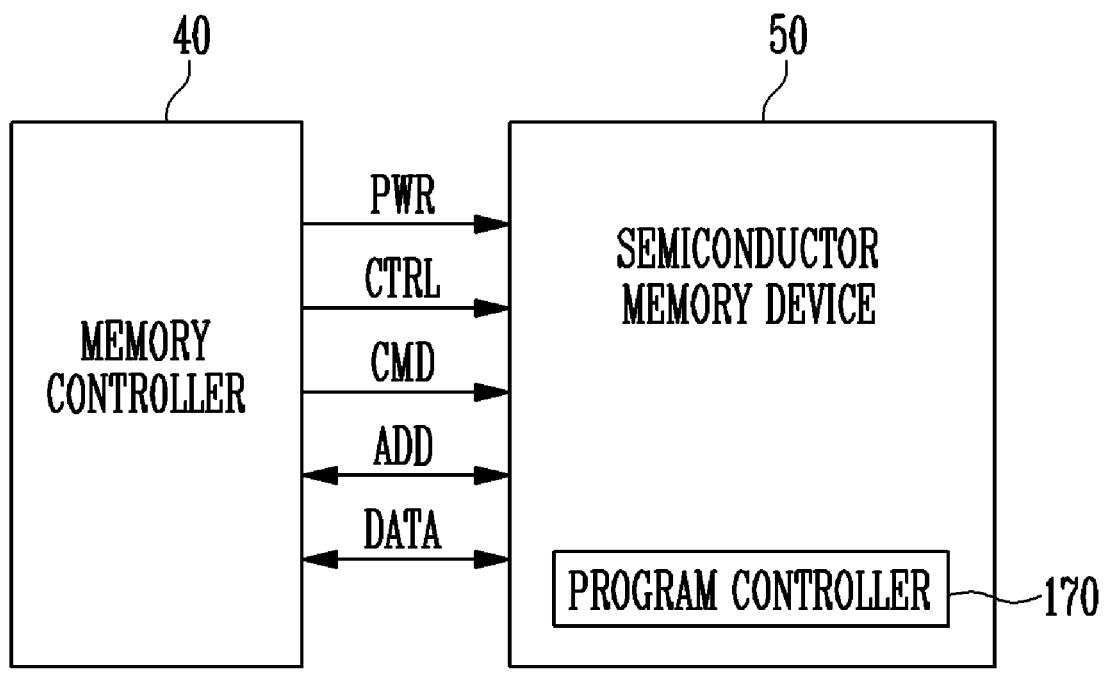
FIG. 1 is a block diagram illustrating a memory system according to an embodiment of the present disclosure.

The technical spirit of the present disclosure may include examples of embodiments to which various modifications and changes may be applied and which include various forms. Hereinafter, embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

Examples of embodiments will now be described hereinafter with reference to the accompanying drawings. However, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. The word "connected," as used herein for some embodiments, means that two components are directly connected with one another. For example, a first component connected to a second component means the first component is contacting the second component. For other embodiments, connected components have one or more intervening components. For example, a first component is connected to a second component when the first and second components are both in contact with a common third component even though the first component is not directly contacting the second component.

Embodiments may provide a three-dimensional memory device capable of improving the operation reliability thereof and an operating method of the memory device.

FIG. 1 is a block diagram illustrating a memory system 30 according to an embodiment.

Referring to FIG. 1, the memory system 30 includes a memory controller 40 and a semiconductor memory device 50. The memory system 30 may include data storage media such as a memory card, a Universal Serial Bus (USB) memory, and a Solid State Drive (SSD), etc.

The semiconductor memory device 50 may perform a program operation, an erase operation, and a read operation under the control of the memory controller 40. The semiconductor memory device 50 may receive a command CMD and an address ADD from the memory controller 40 through input/output lines. The semiconductor memory device 50 may exchange data DATA with the memory controller 40 through the input/output lines. Also, the semiconductor memory device 50 may be supplied with power PWR from the memory controller 40 through a power line, and receive a control signal CTRL from the memory controller 40 through a control line. The control signal CTRL may include a command latch enable signal, an address latch enable signal, a chip enable signal, a program enable signal, a read enable signal, and the like.

The semiconductor memory device 50 may include a program controller 170. The program controller 170 may control a program operation, using a program method according to an embodiment of the present disclosure. The program controller 170 may set voltage levels of a plurality of operating voltages respectively corresponding to a plurality of program states. The plurality of operating voltages may include program voltages, verify voltages, bit line voltages, a program inhibit voltage, and the like. According to an embodiment of the present disclosure, when the program controller 170 sets operating voltages with respect to each program state, the program controller 170 may control voltage levels of bit line voltages. The bit line voltages are controlled to have a level lower than that of a program inhibit voltage applied to a bit line connected to a memory cell that has been completely programmed among memory cells. Hereinafter, a memory cell that has been completely programmed is defined as a programmed cell, and a bit line connected to the programmed cell is defined as a program inhibit bit line.

In an embodiment, the program controller 170 may set bit line voltages applied to bit lines of a three-dimensional memory array. The bit lines of the three-dimensional memory array may be connected to channel structures penetrating word lines stacked to be spaced apart from each other. According to an embodiment of the present disclosure, the program controller 170 may control the bit line voltages such that the levels of the bit line voltages increase when the channel structures become closer to edges of the word lines.

The memory system 30 according to an embodiment of the present disclosure may narrow a threshold voltage distribution range with respect to each of the program states, using bit line voltages varied by the program controller 170 of the semiconductor memory device 50.

Figure 2:
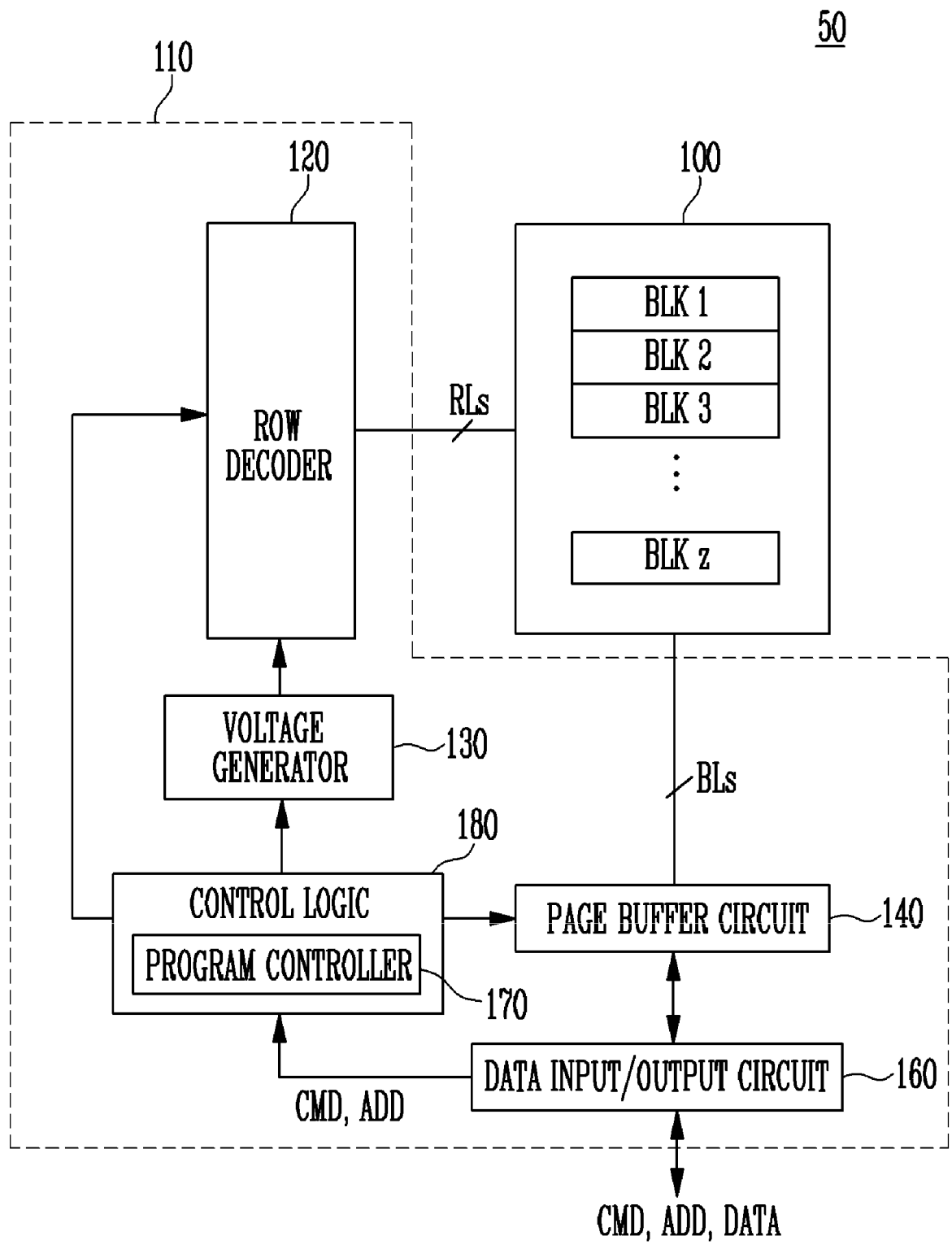
FIG. 2 is a block diagram illustrating, for example, a semiconductor memory device shown in FIG. 1.

FIG. 2 is a block diagram illustrating, for example, the semiconductor memory device 50 shown in FIG. 1.

Referring to FIG. 2, the semiconductor memory device 50 includes a memory cell array 100 and a peripheral circuit 110.

The semiconductor memory device 50 may be a nonvolatile memory device. For example, the semiconductor memory device 50 may be a flash memory. The peripheral circuit 110 includes a row decoder 120, a voltage generator 130, a page buffer circuit 140, a data input/output circuit 160, and a control logic 180. In an embodiment, the control logic 180 may include a program controller 170. The program controller 170 may control voltage levels of bit line voltages as described with reference to FIG. 1. The control logic 180 may be implemented in hardware, software, or a combination thereof. For example, the control logic 180 may be realized as a control logic circuit operating in accordance with an algorithm. The program controller 170 may be implemented in hardware, software, or a combination thereof. For example, the program controller 170 may be realized as a program controller circuit operating in accordance with an algorithm.

Continuously referring to FIG. 2, the memory cell array 100 includes a plurality of memory blocks BLK1 to BLKz. Each of the memory blocks BLK1 to BLKz is connected to the row decoder 120 through row lines RLs, and is connected to the page buffer circuit 140 through bit lines BLs. The row lines RLs may include word lines and select lines.

The row decoder 120 may receive a row address from the control logic 180, and select a memory block and a word line by decoding the received row address. Accordingly, in a program operation, a program voltage or verify voltage may be provided to a word line of a memory block corresponding to the row address.

The voltage generator 130 may generate various operating voltages under the control of the control logic 180. For example, the voltage generator 130 may generate various operating voltages such as a program voltage, a pass voltage, a read voltage, a verify voltage, an erase voltage, a turn-on voltage, and a turn-off voltage according to an operation code output from the control logic 180. The operating voltages generated by the voltage generator 130 are not limited to the above-described example.

The operating voltages generated by the voltage generator 130 may be transferred to the row lines RLs of the selected memory block by the row decoder 120.

The page buffer circuit 140 may include a page buffer connected to the bit lines BLs, and the page buffer may include a plurality of latches. The page buffer circuit 140 may temporarily store data to be programmed in memory cells connected to the selected word line or data read from the memory cells. In a program operation, the page buffer circuit 140 may generate bit line voltages having various levels and apply the generated bit line voltages to the bit lines BLs under the control of the program controller 170 included in the control logic 180.

The data input/output circuit 160 may transfer data DATA input from the memory controller 40 shown in FIG. 1 to the page buffer circuit 140, or provide data DATA input from the page buffer circuit 140 to the memory controller 40 shown in FIG. 1.

Continuously referring to FIG. 2, the control logic 180 may control the voltage generator 130 and the page buffer circuit 140 in response to a command CMD, and control the row decoder 120 and the page buffer circuit 140 in response to an address ADD. Also, the control logic 180 may transmit signals for a next operation to the voltage generator 130 and the page buffer circuit 140 in response to a pass or fail signal. For example, the control logic 180 may control a program operation, a read operation, and an erase operation of the semiconductor memory device 50 in response to the command CMD.

In an embodiment, the program controller 170 included in the control logic 180 may set bit line voltages such that the levels of the bit line voltages increase when channel structures of the memory cell array 100 become closer to edges of the word lines. In an embodiment, the program controller 170 may be separately located at the outside of the control logic 180.

Figure 3:
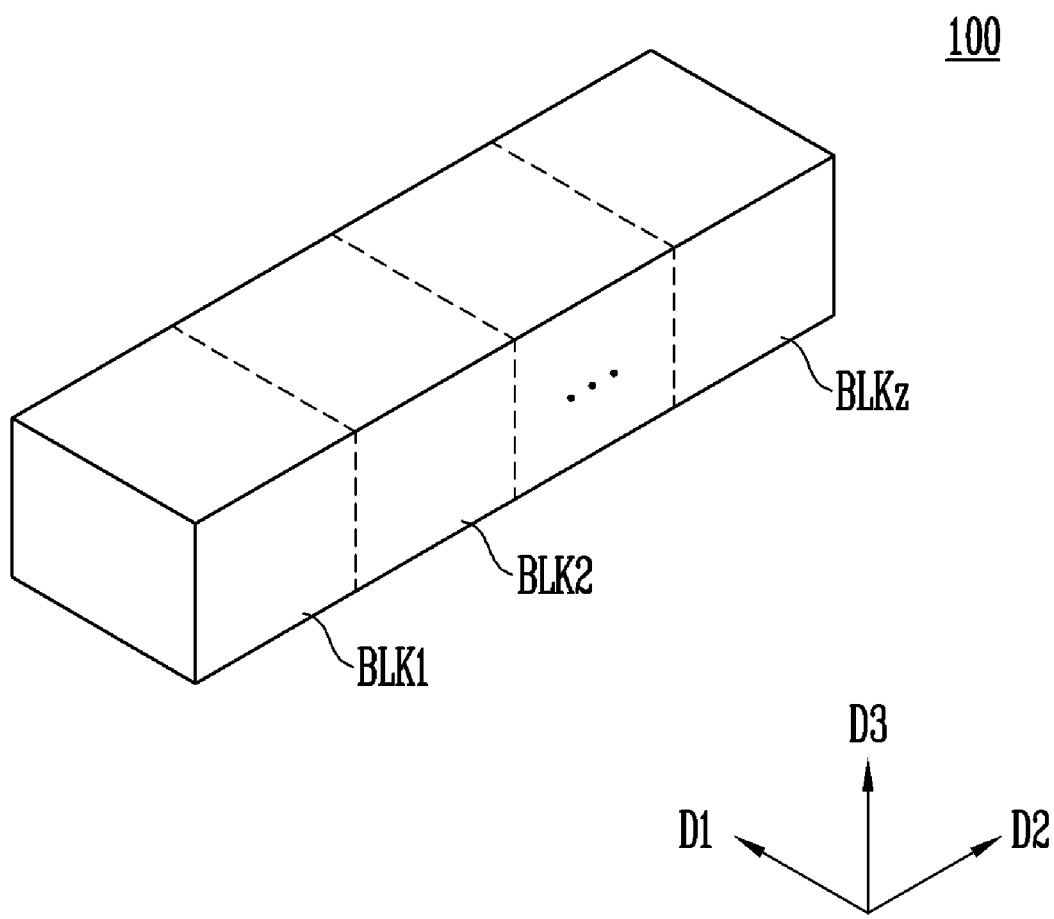
FIG. 3 is a block diagram illustrating a memory cell array shown in FIG. 2.

FIG. 3 is a block diagram illustrating the memory cell array 100 shown in FIG. 2.

Referring to FIG. 3, the memory cell array 100 includes a plurality of memory blocks BLK1 to BLKz. Each of the memory blocks BLK1 to BLKz is formed in a three-dimensional structure. For example, each of the memory blocks BLK1 to BLKz includes memory strings arranged along first and second directions D1 and D2, which are different from each other, on a substrate. Each of the memory strings includes memory cells arranged along a third direction D3 vertical to a plane extending in the first and second directions D1 and D2.

Figure 4A:
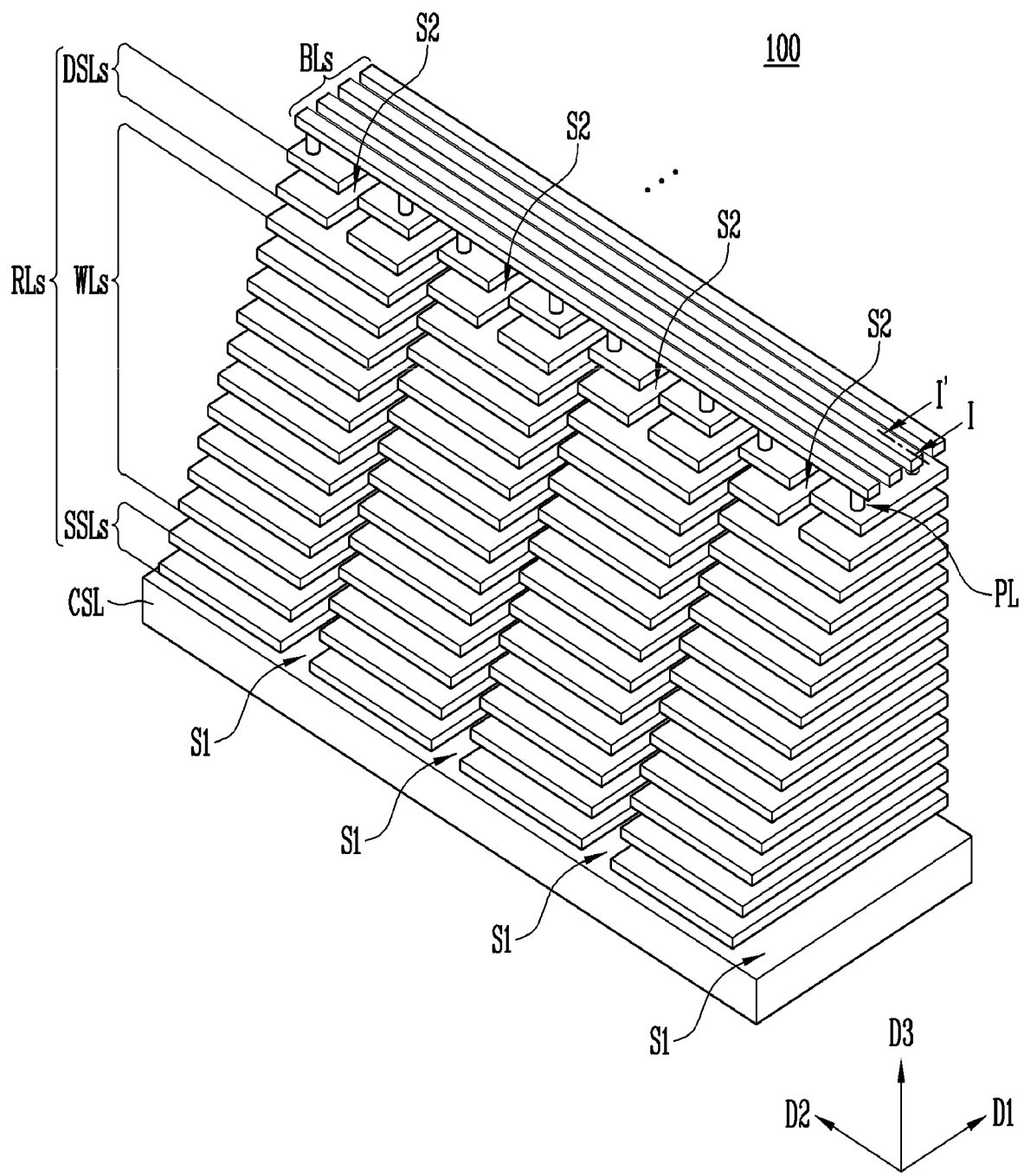
FIGS. 4A to 4C are diagrams illustrating an embodiment of the memory cell array shown in FIG. 3.
Figure 4B:
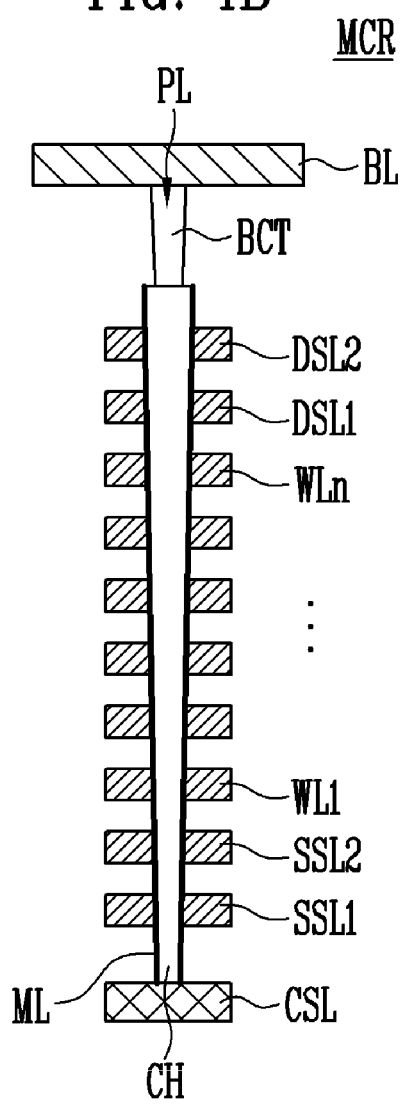
Figure 4C:
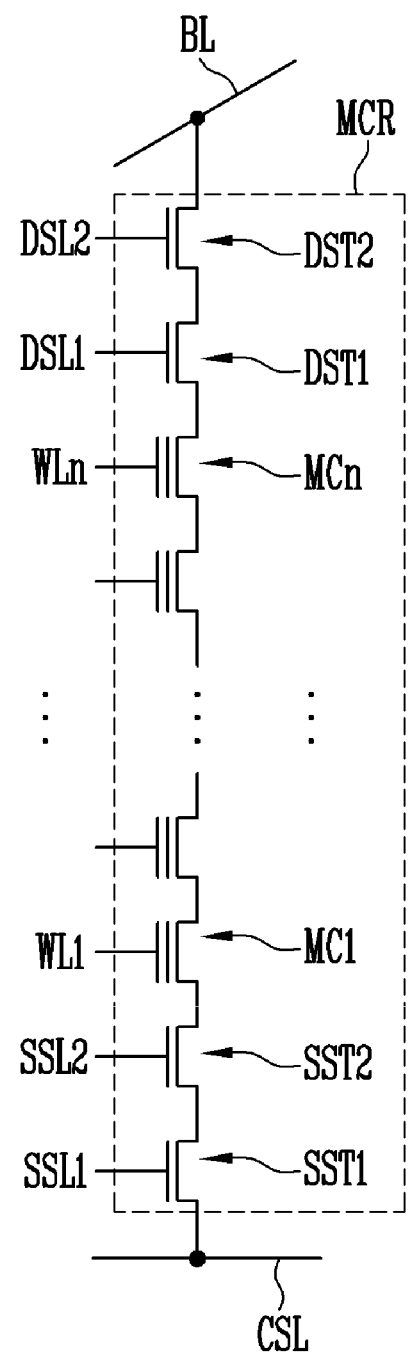

FIGS. 4A to 4C are diagrams illustrating an embodiment of the memory cell array shown in FIG. 3. FIG. 4A illustrates a structure of the memory cell array 100. FIG. 4B illustrates a sectional view of a memory string MCR taken along line I-I' shown in FIG. 4A. FIG. 4C illustrates an equivalent circuit diagram of the memory string MCR shown in FIG. 4B.

Referring to FIG. 4A, the memory cell array 100 may include pillar structures PL connected between a common source line CSL and bit lines BLs, and row lines RLs surrounding the pillar structures PL. The row lines RLs may include source select lines SSLs, word lines WLs, and drain select lines DSLs.

The source select lines SSLs may be disposed on the common source line CSL. In an embodiment, the source select lines SSLs may be disposed in a single layer to be spaced apart from each other in a second direction D2. In an embodiment, the source select lines SSLs may be respectively disposed in each of two or more layers spaced apart from each other in a third direction D3 to be spaced apart from each other in the second direction D2.

The word lines WLs may be disposed on the source select lines SSLs. The word lines WLs may be stacked in the third direction D3 to be spaced apart from each other.

The drain select lines DSLs may be disposed on the word lines WLs. In an embodiment, the drain select lines DSLs may be disposed in a single layer to be spaced apart from each other in the second direction D2. In an embodiment, the drain select lines DSLs may be disposed in each of two or more layers spaced apart from each other in the third direction D3. The drain select lines DSLs disposed in each of the two or more layers may be spaced apart from each other in the second direction D2.

The row lines RLs may be separated from each other by first slits S1. The row lines RLs and the first slits S1 may extend in a first direction D1. The first slits S1 may be arranged in the second direction D2.

Drain select lines DSLs disposed in the same layer among row lines RLs disposed between first slits S1 adjacent to each other in the second direction D2 may be separated from each other by a second slit S2. Accordingly, pillar structures PL shared by each of the word lines WLs may be divided into sub-groups that are separated by the second slit S2. The pillar structures PL of the sub-groups are controlled by the drain select lines corresponding thereto. In an embodiment, one second slit S2 may be disposed between first slits S1 adjacent to each other in the second direction D2. The embodiments of the present disclosure are not limited thereto. For example, two or more second slits parallel to each other may be disposed between first slits S1 adjacent to each other in the second direction D2.

Row lines RLs disposed between first slits S1 adjacent to each other in the second direction D2 may constitute one stack group. Each of the memory blocks BLK1 to BLKz shown in FIG. 3 may include one stack group or include two or more stack groups.

Referring to FIG. 4B, a memory string MCR may be defined along each of pillar structures PL, which is connected between a bit line BL and the common source line CSL.

Each of the pillar structure PL may include a channel structure CH. The channel structure CH penetrates at least one source select line (e.g., SSL1 and SSL2), word lines WL1 to WLn, and at least one drain select line (e.g., DSL1 and DSL2).

A sidewall of the channel structure CH may be surrounded by a multi-layered memory layer ML. The multi-layered memory layer ML may include a data storage layer in which data can be stored. The multi-layered memory layer ML may further include a tunnel insulating layer disposed between the data storage layer and the channel structure CH. The multi-layered memory layer ML may further include a blocking insulating layer extending along an outer wall of the data storage layer. The channel structure CH may include a semiconductor layer used as a channel region.

The channel structure CH is connected between the common source line CSL and the bit line BL. The common source line CSL may be in contact with a bottom surface of the channel structure CH. The bit line BL may be electrically connected to the channel structure CH via a bit contact plug BCT.

Referring to FIG. 4C, the memory string MCR connected to the bit line BL and the common source line CSL may include at least one source select transistor (e.g., SST1 and SST2), memory cells MC1 to MCn, and at least one drain select transistors (e.g., DST1 and DST2).

Gates of the source select transistors SST1 and SST2 are connected to source select lines SSL1 and SSL2. The source select transistors SST1 and SST2 are connected in series between the common source line CSL and a first memory cell MC1 by the channel structure CH shown in FIG. 4B. Gates of the drain select transistors DST1 and DST2 are connected to the drain select lines DSL1 and DSL2. The drain select transistors DST1 and DST2 are connected in series between the bit line BL and an nth memory cell MCn by the channel structure CH shown in FIG. 4B. Gates of the memory cells MC1 to MCn are connected to word lines WL1 to WLn. The memory cells MC1 to MCn are connected in series by the channel structure CH shown in FIG. 4B.

Figure 5A:
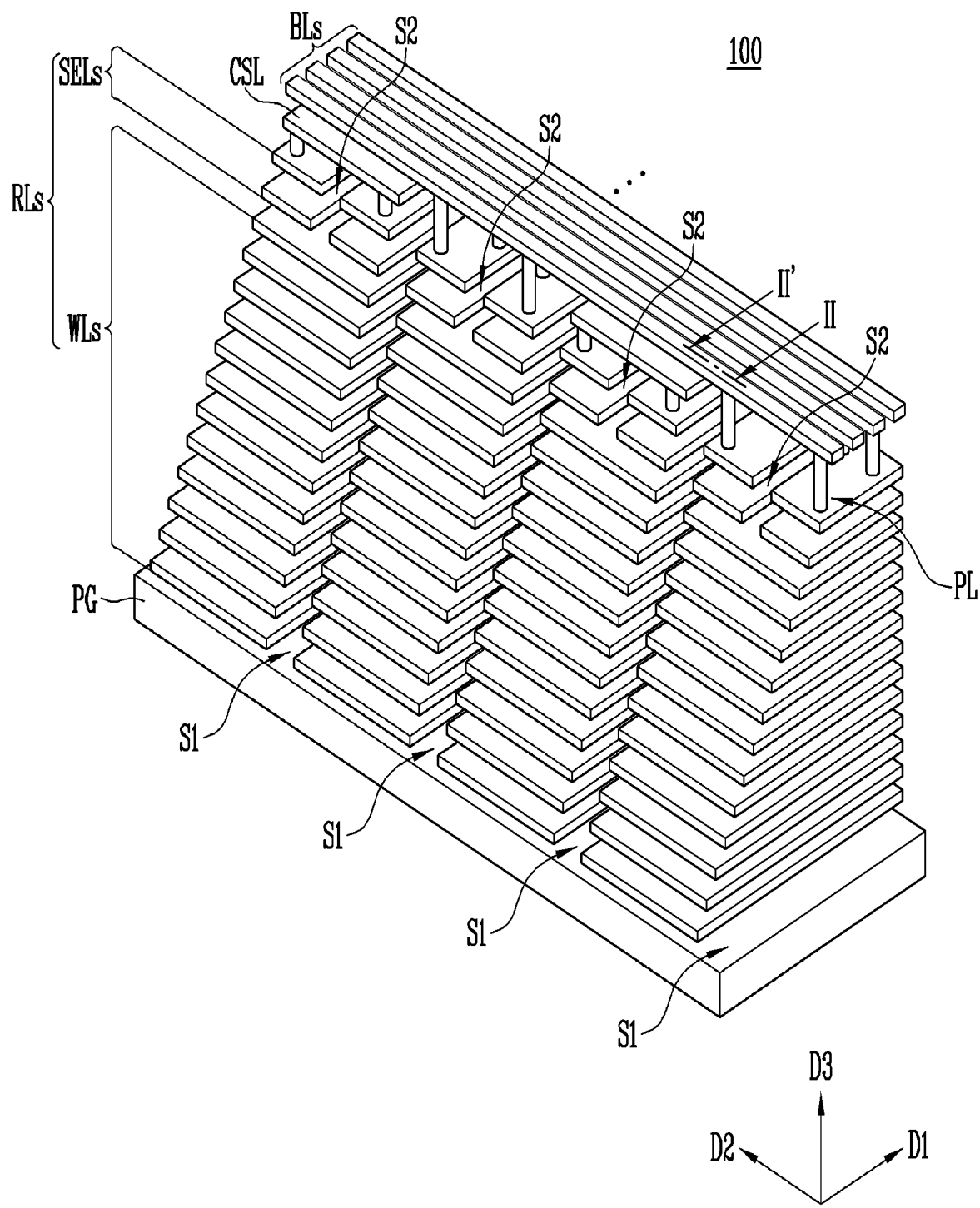

FIGS. 5A to 5C are diagrams illustrating an embodiment of the memory cell array shown in FIG. 3. FIG. 5A illustrates a structure of the memory cell array 100. FIG. 5B illustrates a sectional view of a memory string MCR taken along line II-II' shown in FIG. 5A. FIG. 5C illustrates an equivalent circuit diagram of the memory string MCR shown in FIG. 5B.

Referring to FIG. 5A, the memory cell array 100 may include pillar structures PL connected between common source lines CSL and bit lines BLs, and row lines RLs surrounding the pillar structures PL. The row lines RLs may include select lines SELs and word lines WLs.

The select lines SELs may be disposed under the common source lines CSL and the bit lines BL. In an embodiment, the select lines SELs may be disposed in a single layer to be spaced apart from each other in a second direction D2. In an embodiment, the select lines SELs may be disposed in each of two or more layers spaced apart from each other in a third direction D3 to be spaced apart from each other in the second direction D2.

The word lines WLs are disposed between a pipe gate PG and the select lines SELs, and are stacked to be spaced apart from each other in the third direction D3.

The row lines RLs may be separated from each other by first slits S1. The row lines RLs and the first slits S1 may extend in a first direction D1. The first slits S1 may be arranged in the second direction D2.

The word lines WLs may overlap with second slits S2. Each of the second slits S2 is disposed between first slits S1 adjacent to each other in the second direction D2, and is formed to separate select lines SELs disposed in the same layer from each other.

The select lines SELs may be divided into a plurality of select groups by the first slits S1. Odd-numbered or even-numbered source select groups in the second direction D2 among the select groups overlap with the common source lines CSL, and the other drain select groups are opened between the common source lines CSL. The common source lines CSL may be disposed between the select lines SELs included in the source select groups and the bit lines BLs.

The word lines WLs may be divided into a plurality of word groups by first slits S1 adjacent to each other in the second direction D2. The word groups may be divided into first word groups overlapping with the common source lines CSL and second word groups opened between the common source lines CSL. The common source lines CSL may be connected to each other.

Each of the pillar structure PL includes first to third parts. The first part extends from one source line corresponding thereto among the common source lines CSL, penetrates one source select group corresponding thereto among the source select groups, and penetrates one word group corresponding thereto among the first word groups. The second part extends from one bit line corresponding thereto among the bit lines BLs, penetrates one drain select group corresponding thereto among the drain select groups, and penetrates one word group corresponding thereto among the second word groups. The third part may penetrate the pipe gate PG and connect the first part and second part.

Each of the memory blocks BLK1 to BLKz shown in FIG. 3 may include any one of the first word groups and any one of the second word groups, or include two or more first word groups and two or more second word groups.

Referring to FIG. 5B, a memory string MCR may be formed along each of pillar structures PL, which is connected between a bit lines BL and a common source line CSL.

Each of the pillar structures PL includes a first part PL1 as described with reference to FIG. 5A. The first part PL1 penetrates at least one source select line (e.g., SSL1 and SSL2) included in a source select group corresponding thereto and source-side word lines WL1 to WLk included in a first word group corresponding thereto. Each of the pillar structure PL includes a second part PL2 as described with reference to FIG. 5A. The second part PL2 penetrates at least one drain select line (e.g., DSL1 and DSL2) included in a drain select group corresponding thereto and drain-side word lines WLn to WLk+1 included in a second word group corresponding thereto. Each of the pillar structures PL includes a third part PL3 as described with reference to FIG. 5A. The third part PL3 penetrates a pipe gate PG and connects the first part PL1 and the second part PL2.

Each of the pillar structures PL may include a channel structure CH having an outer wall surrounded by a multi-layered memory layer ML. The channel structure CH extends to form the first to third parts PL1 to PL3. The multi-layered memory layer ML may include a tunnel insulating layer, a data storage layer, and a blocking insulating layer as described with reference to FIG. 4B. The channel structure CH may include a semiconductor layer used as a channel region.

The channel structure CH may include both ends respectively connected to the common source line CSL and the bit line BL. The common source line CSL may be electrically connected to one end of the channel structure CH via a source contact plug SCT. The bit line BL may be electrically connected to the other end of the channel structure CH via a bit contact plug BCT.

Referring to FIG. 5C, the memory string MCR connected to the bit line BL and the common source line CSL may include at least one source select transistor (e.g., SST1 and SST2), source side memory cells MC1 to MCk, a pipe transistor PT, drain-side memory cells MCk+1 to MCn, and at least one drain select transistor (e.g., DST1 and DST2).

Gates of the source select transistors SST1 and SST2 are connected to source select lines SSL1 and SSL2. The source select transistors SST1 and SST2 are connected in series between the common source line CSL and a first memory cell MC1 by the channel structure CH shown in FIG. 5B. Gates of the drain select transistors DST1 and DST2 are connected to the drain select lines DSL1 and DSL2. The drain select transistors DST1 and DST2 are connected in series between the bit line BL and an nth memory cell MCn by the channel structure CH shown in FIG. 5B. Gates of the source-side memory cells MC1 to MCk are connected to source-side word lines WL1 to WLk. The source-side memory cells MC1 to MCk are connected in series by the channel structure CH shown in FIG. 5B. Gates of the drain-side memory cells MCk+1 to MCn are connected to drain-side word lines WLk+1 to WLn. The drain-side memory cells MCk+1 to MCn are connected in series by the channel structure CH shown in FIG. 5B. A (k+1)th memory cell MCk+1 and a kth memory cell MCk are connected in series by the pipe transistor PT. A pipe gate PG is used as a gate of the pipe transistor PT.

Each of the memory cells MC1 to MCn shown in FIGS. 4C and 5C may store one-bit data or multi-bit data of two bits or more. A memory cell capable of storing one-bit data is defined as a Single Level Cell (SLC), and a memory cell capable of storing multi-bit data is defined as a Multi Level Cell (MLC). The SLC or the MLC may be programmed with data corresponding to a threshold voltage distribution in a certain range. The MLC has a plurality of threshold voltage distributions corresponding to a plurality of program states. The operation reliability of the three-dimensional memory device may be improved when the width of a threshold voltage distribution with respect to the same data is narrowed. The width of the threshold voltage distribution may be widened due to various causes.

Figure 6A:
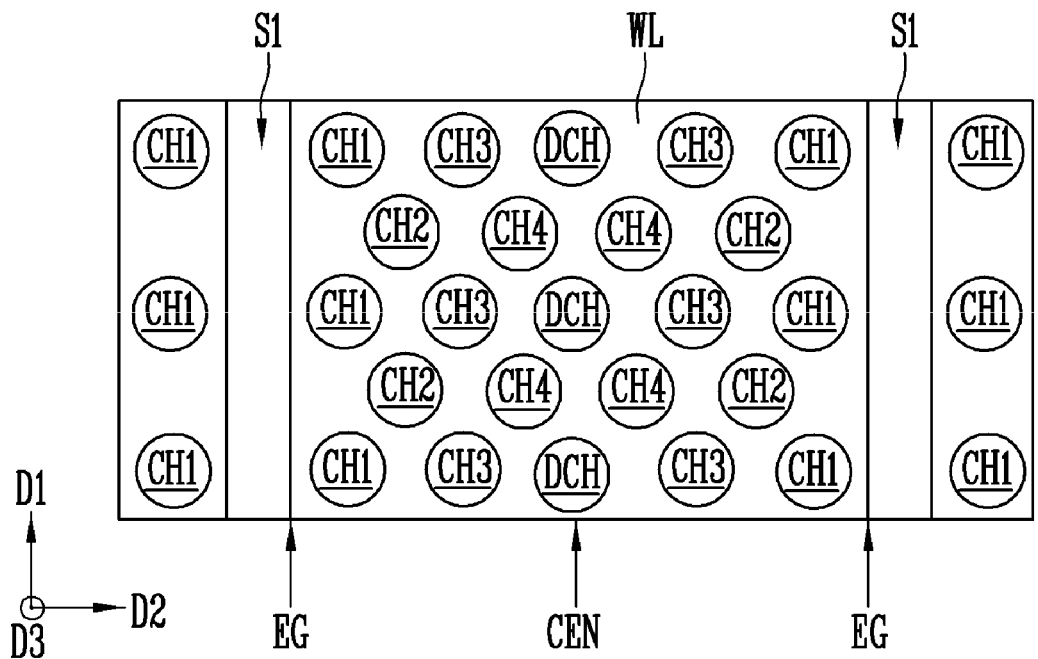
FIGS. 6A and 6B are plan views illustrating channel structures according to an embodiment of the present disclosure.
Figure 6B:
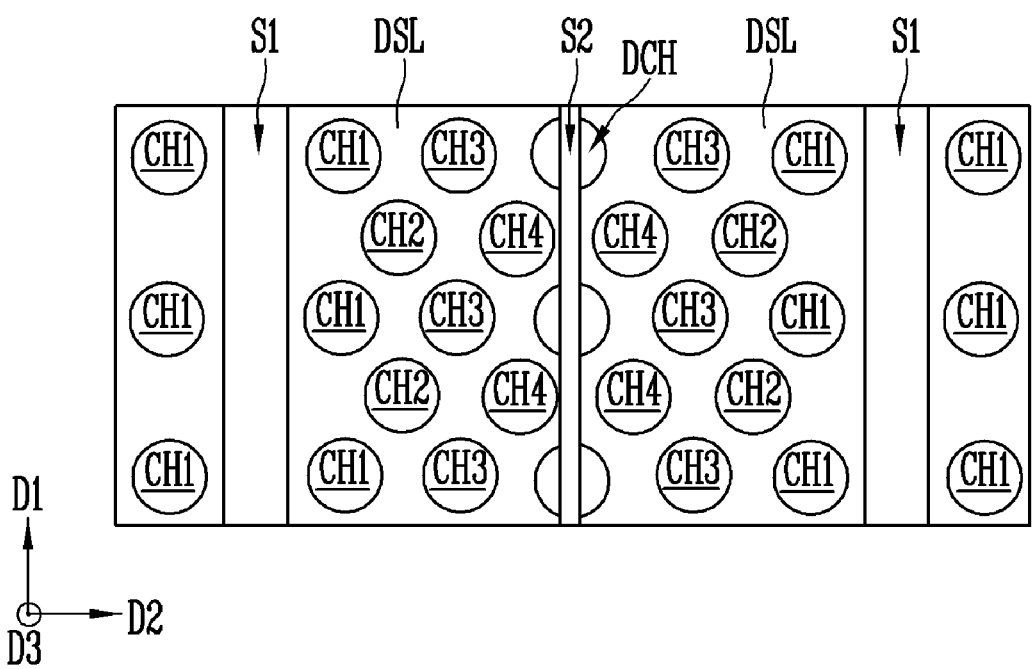

FIGS. 6A and 6B are plan views illustrating channel structures according to an embodiment. FIG. 6A may be a plan view illustrating an example of channel structures penetrating word lines disposed in the same layer among the word lines WLs shown in FIG. 4A. In another example, the channel structures shown in FIG. 6A may be used as channel structures penetrating word lines disposed in the same layer among the word lines WLs shown in FIG. 5A. FIG. 6B may be a plan view illustrating an example of channel structures penetrating drain select lines disposed in the same layer among the drain select lines DSLs shown in FIG. 4A. In another example, the channel structures shown in FIG. 6B may be used as channel structures penetrating select lines disposed in the same layer among the select lines SELs shown in FIG. 5B.

Referring to FIGS. 6A and 6B, a plurality of channel structures CH1 to CH4 may be arranged between first slits S1 adjacent to each other in a second direction D2. Each of the channel structures CH1 to CH4 may extend in a third direction D3 to a word line WL and a drain select line DSL, which correspond thereto.

Referring to FIG. 6A, the word line WL may be penetrated by channel structures CH1 to CH4 of two columns or more, which are disposed toward a center region CEN of the word line WL from an edge EG of the word line WL. In an embodiment, the channel structures CH1 to CH4 penetrating the word line WL may include channel structures of first to fourth columns, which are arranged toward the center region CEN of the word line WL from the edge EG of the word line WL. Each column of the channel structures may include a plurality of channel structures disposed in a first direction D1. For example, the channel structures of the first column may include first channel structures CH1 disposed in the first direction D1, the channel structures of the second column may include second channel structures CH2 disposed in the first direction D1, the channel structures of the third column may include third channel structures CH3 disposed in the first direction D1, and the channel structures of the fourth column may include fourth channel structures CH4 disposed in the first direction D1. The channel structures CH1 to CH4 penetrating the word line WL may be symmetrically arranged about an axis, the axis extending in the first direction and disposed at the center region CEN of the word line WL.

In order to improve the degree of integration, the channel structures CH1 to CH4 may be arranged to form a zigzag pattern in the first direction D1 and the second direction D2. The embodiments of the present disclosure are not limited thereto. For example, the channel structures CH1 to CH4 may be arranged in parallel to each other in the first direction D1 and the second direction D2.

The center region CEN of the word line WL may be penetrated by dummy channels DCH. The dummy channels DCH may be disposed in a line in the first direction D1. The channel structures CH1 to CH4 may be symmetrically arranged about the dummy channels DCH.

Referring to FIG. 6B, the channel structures CH1 to CH4 and the dummy channels DCH, which are described with reference to FIG. 6A, may extend in the third direction D3 to penetrate drain select lines DSL. A second slit S2 disposed between first slits S1 adjacent to each other in the second direction D2 may extend to overlap with the dummy channels DCH. The channel structures CH1 to CH4 may be symmetrically arranged about the second slit S2.

Referring back to FIGS. 6A and 6B, the channel structures CH1 to CH4 may be formed in different shapes depending on their separation distances from the first slits S1. The channel structures CH1 to CH4 extend to penetrate a stack structure of the word lines WLs shown in FIG. 4A or 5B. The process of forming the channel structures CH1 to CH4 may include a process of forming holes corresponding to the channel structures CH1 to CH4 by etching each of stack structures separated from each other by the first slits S1. During the etching process of the stack structures for forming the holes, side holes adjacent to the first slits S1 among the holes may be formed narrower than the other holes. As a result, the first channel structures CH1 of the first column, which are adjacent to the edge EG of the word line WL, among the channel structures CH1 to CH4 are formed narrower than the channel structures (e.g., CH2 to CH4) of the other columns.

As described above, the channel structures CH1 to CH4 may be formed with different widths depending on their separation distances from the edge EG of the word line WL. Accordingly, memory cells connected to the word line WL surrounding the channel structures CH1 to CH4 may have different program speeds. The program speed of memory cells corresponding to the first channel structures CH1 formed with a relatively narrow width is faster than that of memory cells corresponding to the other channel structures (e.g., CH2 to CH4) formed with a relatively wide width. The width of a threshold voltage distribution may be widened due to the difference in program speed between the memory cells.

In an embodiment of the present disclosure, the difference in program speed between the memory cells depending on the separation distances of the channel structures CH1 to CH4 from the edge EG of the word line WL may be minimized by differentiating bit line voltages during a program operation. Accordingly, in an embodiment of the present disclosure, the width of a threshold voltage distribution with respect to the same program state is reduced, so that the operation reliability of the three-dimensional memory device may be improved.

Figure 7:
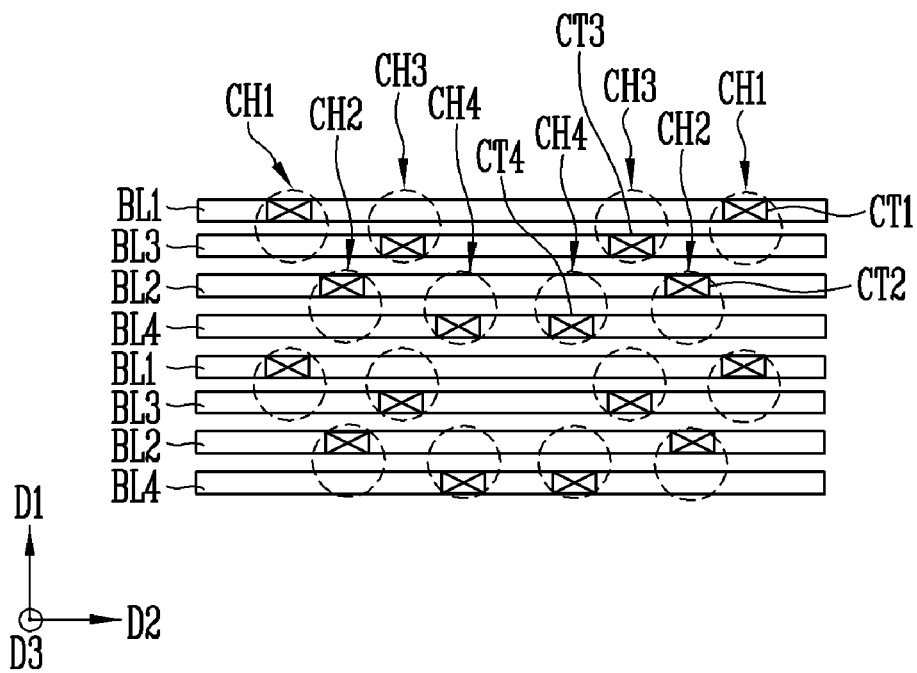
FIG. 7 is a plan view illustrating channel structures and bit lines according to an embodiment of the present disclosure.

FIG. 7 is a plan view illustrating channel structures and bit lines according to an embodiment. Channel structures CH1 to CH4 shown in FIG. 7 are shared by one word line, and correspond to the first to fourth channel structures CH1 to CH4 shown in FIGS. 6A and 6B.

Referring to FIG. 7, each of first channel structures CH1 adjacent to an edge of a word line may be electrically connected to a first bit line BL1 through a first contact plug CT1. Each of second channel structures CH2 may be connected to a second bit line BL2 through a second contact plug CT2, each of the third channel structures CH3 may be connected to a third bit line BL3 through a third contact plug CT3, and each of fourth channel structures CH4 may be connected to a fourth bit line BL4 through a fourth contact plug CT4.

During a program operation, bit line voltages applied to the first to fourth bit lines BL1 to BL4 may be set higher when the channel structures CH1 to CH4 become closer to the edge of the word line.

For example, the first to fourth channel structures CH1 to CH4 may be divided into a first channel group adjacent to the edge of the word line and the other second channel group. In other words, the second channel group may be spaced apart from the edge of the selected word line with the first channel group interposed between the second channel group and the edge of the selected word line. For example, the first channel structures CH1 may be included in the first channel group, and the second to fourth channel structures CH2 to CH4 may be included in the second channel group. During the program operation, a bit line voltage having a first level may be applied to the first bit line BL1 connected to the first channel structures CH1 of the first channel group, and the bit line voltage having a second level lower than the first level may be applied to each of the second to fourth bit lines BL2 to BL4 connected to the second to fourth channel structures CH2 to CH4 of the second channel group.

Figure 8A:
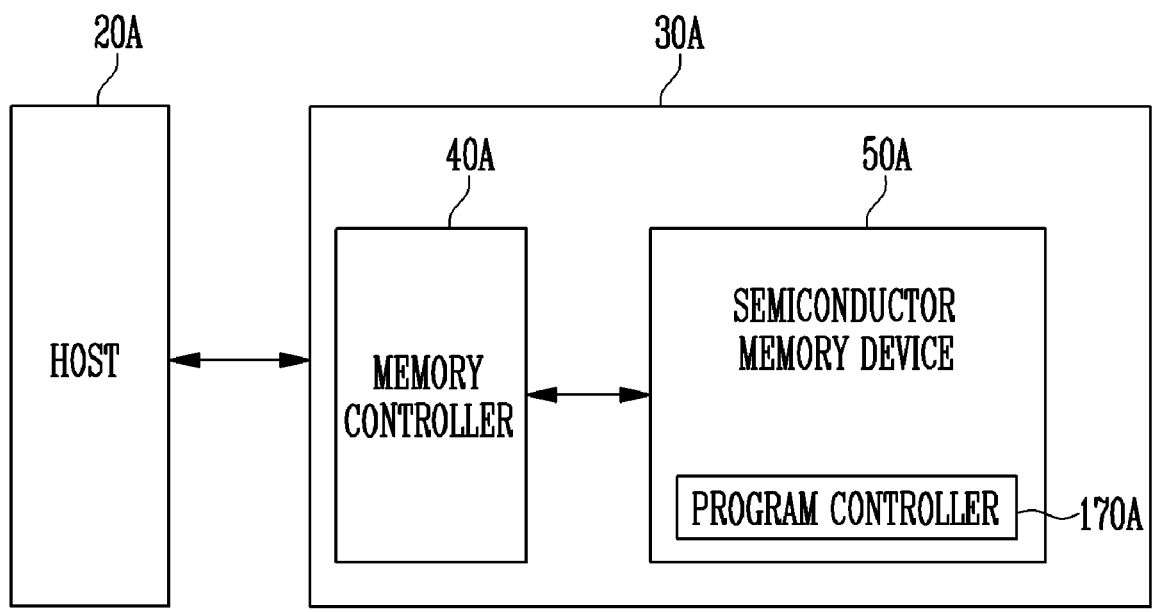
FIGS. 8A and 8B are block diagrams illustrating data processing systems according to embodiments of the present disclosure.
Figure 8B:
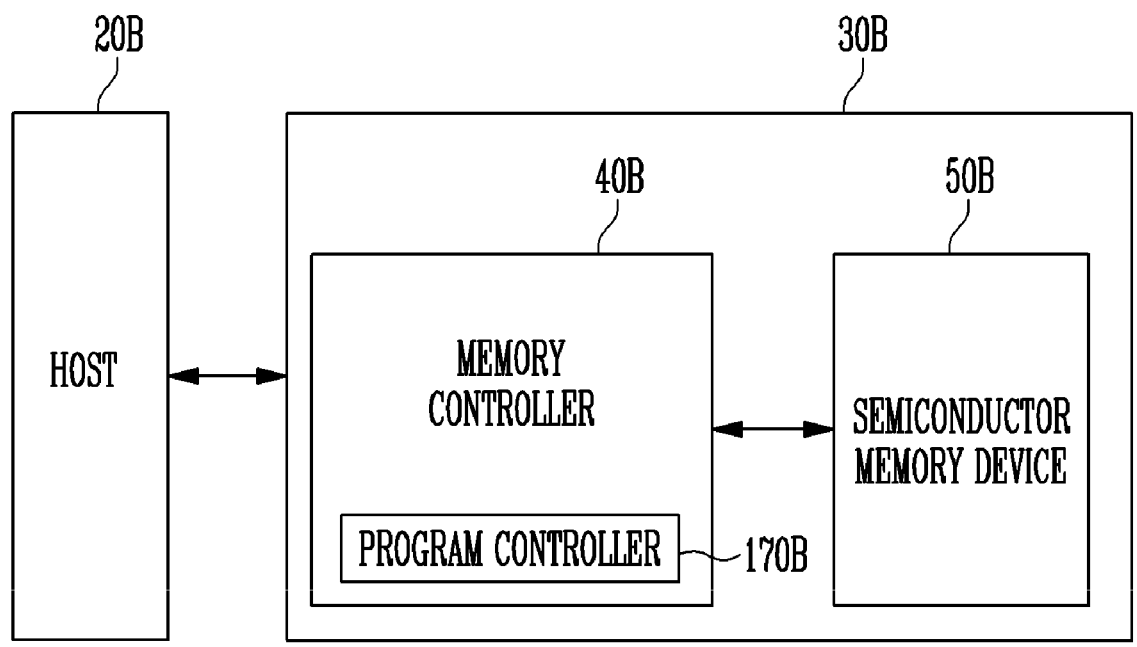

FIGS. 8A and 8B are block diagrams illustrating data processing systems 10A and 10B according to embodiments.

Referring to FIGS. 8A and 8B, the data processing systems 10A and 10B include hosts 20A and 20B and memory systems 30A and 30B, respectively.

The host 20A or 20B may communicate with the memory system 30A or 30B through at least one of various interface protocols. The interface protocol may be one of protocols such as a Peripheral Component Interconnect (PCI) protocol, a Peripheral Component Interconnect-Express (PCI-E) protocol, an Advanced Technology Attachment (ATA) protocol, a Serial ATA (SATA) protocol, a Parallel ATA (PATA) protocol, a Small Computer Small Interface (SCSI) protocol, a serial Attached SCSI (SAS) protocol, a Universal Serial Bus (USB) protocol, a Multi-Media Card (MMC) protocol, an Enhanced Small Disk Interface (ESDI) protocol, and an Integrated Drive Electronics (IDE) protocol.

The memory systems 30A and 30B may include memory controller 40A and 40B and the semiconductor memory devices 50A and 50B, respectively.

The memory controller 40A or 40B controls overall operations of the memory system 30A or 30B, and controls data exchange between the host 20A or 20B and the semiconductor memory device 50A or 50B. For example, the memory controller 40A or 40B may control a program operation, an erase operation, a read operation, and the like of the semiconductor memory device 50A or 50B in response to a request from the host 20A or 20B. For example, when a request from the host 20A or 20B is received, the memory controller 40A or 40B may generate a command and an address, which correspond to the received request, and provide the command and the address to the semiconductor memory device 50A or 50B.

The semiconductor memory device 50A or 50B may include a nonvolatile memory device capable of retaining stored data even when power is not supplied. In an example, the semiconductor memory device 50A or 50B may be a NAND flash memory. The semiconductor memory device 50A or 50B may perform a program operation, an erase operation or a read operation in response to the command and the address, which are provided from the memory controller 40A or 40B.

Referring to FIG. 8A, a program controller 170A may be included in the semiconductor memory device 50A as described with reference to FIG. 1. Referring to FIG. 8B, a program controller 170B may be included in the memory controller 40B. The data processing system 10A or 10B according to the embodiments of the present disclosure may set bit line voltages applied to bit lines during a program operation to be different depending on distances at which channel structures are spaced apart from an edge of a word line of a memory array. Accordingly, in an embodiment of the present disclosure, the width of a threshold voltage distribution with respect to the same program state may be narrowed.

Figure 9A:
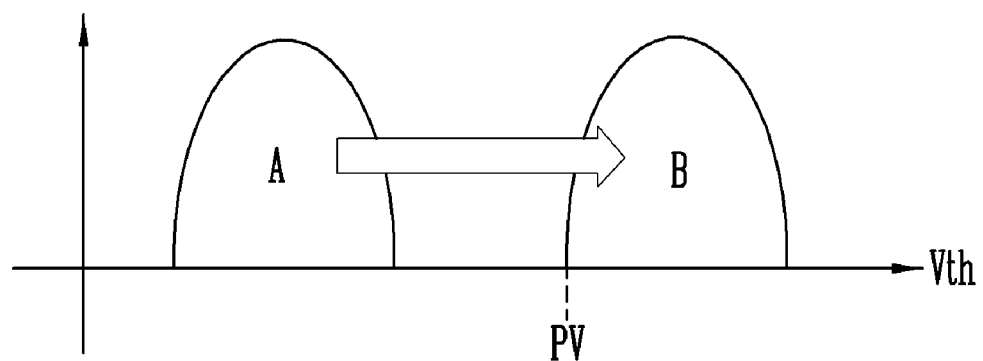
FIGS. 9A and 9B are diagrams illustrating a program operation of the memory cell array according to an embodiment of the present disclosure.
Figure 9B:
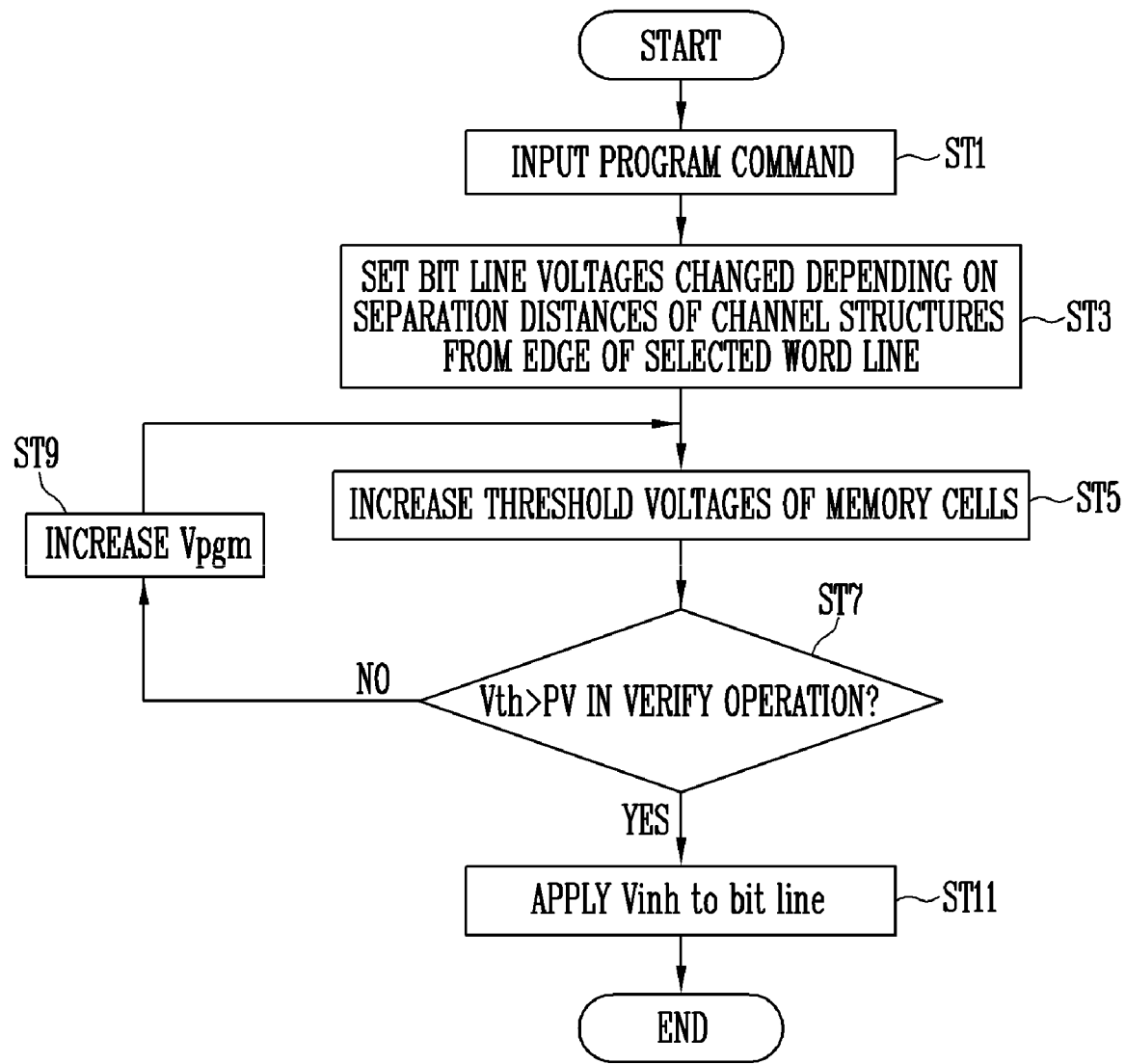

FIGS. 9A and 9B are diagrams illustrating a program operation of the memory cell array according to an embodiment. FIG. 9A is a diagram illustrating, for example, a threshold voltage Vth of a memory cell, which is changed by the program operation. FIG. 9B is a flowchart illustrating the program operation.

Referring to FIG. 9A, memory cells of the memory cell array may have various threshold voltage distributions. For example, the memory cells may have a first threshold voltage distribution A lower than a verify voltage PV. Threshold voltages of the memory cells having the first threshold voltage distribution A may be increased by the program operation, to have a second threshold voltage distribution B higher than the verify voltage PV.

The program operation may be performed based on an Incremental Step Pulse Program (ISPP) scheme. The program operation performed based on the ISPP scheme includes a plurality of program loops. Each of the program loops includes a step of increasing a threshold voltage of a selected memory cell, using a program voltage corresponding to the corresponding program loop, and a step of performing a verify operation of determining whether the threshold voltage of the selected memory cell is higher than the verify voltage PV, using the verify voltage PV.

According to an embodiment of the present disclosure, while memory cells connected to a selected word line are being programmed, bit line voltages applied to bit lines may be set differently depending on separation distances of channel structures from an edge of the selected word line. The bit line voltages are voltages set lower than a program inhibit voltage, and may include a program allow voltage and a program suppression voltage.

The program inhibit voltage is a voltage for inhibiting an increase in threshold voltage of a memory cell connected to the selected word line, and may be a power voltage. The program allow voltage is a voltage used to increase threshold voltages of memory cells having a relatively low program speed, and may be a voltage of 0 V. The program suppression voltage is a voltage used to decrease an increment in threshold voltage of the memory cells having a relatively high program speed. The program suppression voltage is higher than the program allow voltage and is lower than the program inhibit voltage.

In an embodiment, bit line voltages applied to bit lines connected to channel structures during the program operation may be set higher when the channel structures become closer to the edge of the selected word line. As described with reference to FIGS. 6A and 6B, a channel structure close to the edge of the word line may be formed with a narrow width. According to an embodiment of the present disclosure, during the program operation, a bit line voltage applied to a channel structure close to the edge of the word line is controlled higher than that applied to a channel structure close to the center region of the word line. Accordingly, in an embodiment of the present disclosure, a transient increase in threshold voltage of a memory cell having a high program speed among the memory cells connected to the selected word line may be prevented.

Thus, according to an embodiment of the present disclosure, the width of the second threshold voltage distribution B, which is caused by the program operation, may be narrowed.

Hereinafter, a step of programming memory cells connected to a selected word line will be described.

Referring to FIG. 9B, in step ST1, a program command is provided to the semiconductor memory device to perform a program operation.

In step ST3, the semiconductor memory device sets bit line voltages applied to bit lines connected to channel structures to be different from each other depending on separation distances of the channel structures from the edge of the selected word line.

In an embodiment, the bit line voltages may be set higher when the channel structures become closer to the edge of the selected word line. For example, as described with reference to FIG. 7, the channel structures may be divided into a first channel group adjacent to the edge of the word line and the other second channel group. The bit lines may be divided into a first bit line connected to the first channel group and a second bit line connected to the second channel group. In the step ST3, a bit line voltage having a first level may be applied to a first bit line, and the bit line voltage having a second level may be applied to a second bit line. The second level may be set lower than the first level. The bit line voltage having the first level may be a program suppression voltage. The bit line voltage having the second level may be a program allow voltage.

In step ST5, threshold voltages of the memory cells connected to the selected word line are increased based on the bit line voltages set in the step ST3. For example, in the step ST5, the set bit line voltages are applied to the bit lines, and a program voltage Vpgm is applied to the selected word line.

After the program voltage Vpgm is applied to the selected word line, a verify operation is performed in step ST7. During the verify operation (ST7), it is determined whether threshold voltages Vth of the memory cells connected to the selected word line are higher than the verify voltage PV, by applying the verify voltage PV to the selected word line.

As a result obtained by performing the verify operation (ST7), when a memory cell has a threshold voltage that is no more than the verify voltage PV (No), the program voltage Vpgm is increased by a step voltage in step ST9. Subsequently, the steps ST5 and ST7 are repeatedly performed by applying the increased program voltage Vpgm to the selected word line.

As a result obtained by performing the verify operation (ST7), when the memory cell is a programmed cell having a threshold voltage higher than the verify voltage PV (Yes), a program inhibit voltage Vinh is applied to a program inhibit bit line connected to the programmed memory cell among the bit lines in step ST11.

The steps ST5, ST7, ST9, and ST11 are repeated within a limited number of times until threshold voltages of cells to be programmed, which are connected to the selected word line, become higher than the verify voltage PV, and then the program operation is ended (END).

Figure 10A:
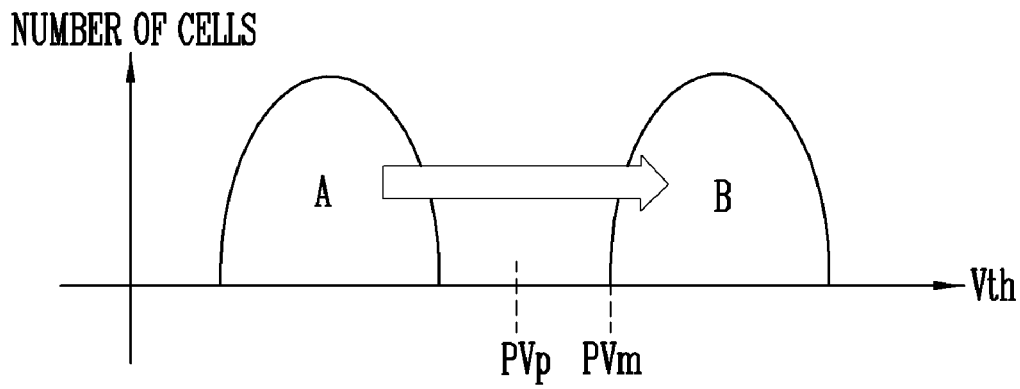
FIGS. 10A and 10B are diagrams illustrating a program operation of the memory cell array according to an embodiment of the present disclosure.
Figure 10B:
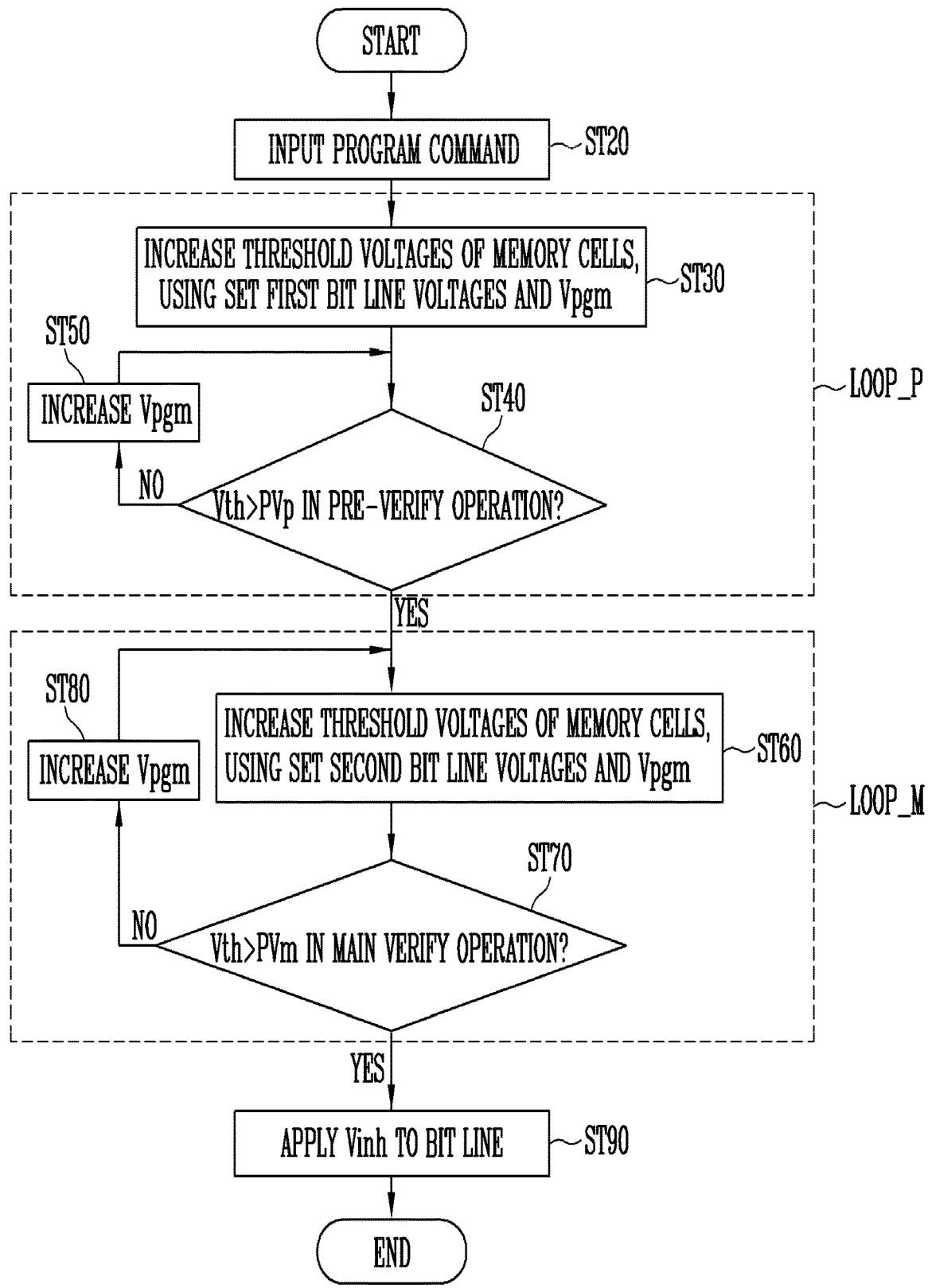

FIGS. 10A and 10B are diagrams illustrating a program operation of the memory cell array according to an embodiment. FIG. 10A is a diagram illustrating, for example, a threshold voltage Vth of a memory cell, which is changed by the program operation. FIG. 10B is a flowchart illustrating in the program operation.

Referring to FIG. 10A, threshold voltages of memory cells having a first threshold voltage distribution A lower than a main verify voltage PVm and a pre-verify voltage PVp may be increased by the program operation, to have a second threshold voltage distribution B higher than the main verify voltage PVm.

The program operation may be performed based on an Incremental Step Pulse Program (ISPP) scheme. The program operation performed based on the ISPP scheme includes a plurality of program loops. Each of the program loops includes a pre-program loop and a main program loop. The pre-program loop includes a step of increasing a threshold voltage of a selected memory cell, using a program voltage corresponding to the corresponding program loop, based on the pre-verify voltage PVp, and a step of performing a verify operation of determining whether the threshold voltage of the selected memory cell is higher than the pre-verify voltage PVp, using the pre-verify voltage PVp. The main program loop includes a step of increasing a threshold voltage of a selected memory cell, using a program voltage corresponding to the corresponding program loop, based on the main verify voltage PVm, and a step of performing a verify operation of determining whether the threshold voltage of the selected memory cell is higher than the main verify voltage PVm, using the main verify voltage PVm.

In an embodiment of the present disclosure, while at least one of the pre-program loop and the main program loop is being performed, bit line voltages applied to bit lines connected to channel structures may be changed depending on separation distances of the channel structures from an edge of a selected word line. The bit line voltages are voltages set lower than a program inhibit voltage, and may include a program allow voltage and a program suppression voltage.

The program inhibit voltage, the program allow voltage, and the program suppression voltage are the same as described with reference to FIG. 9A.

In an embodiment, while at least one of the pre-program loop and the main program loop is being performed, the bit line voltages applied to the bit lines may be set higher when the channel structures become closer to the edge of the selected word line. Accordingly, like the embodiments described with reference to FIG. 9A, in an embodiment of the present disclosure, the width of the second threshold voltage distribution B, which is caused by the program operation, may be narrowed.

Hereinafter, a step of programming memory cells connected to a selected word line will be described.

Referring to FIG. 10B, in step ST20, a program command is provided to the semiconductor memory device to perform a program operation.

When the program operation of the selected word line is started according to the program command, a pre-program loop LOOP_P is performed.

The pre-program loop LOOP_P is performed such that the memory cells connected to the selected word line have threshold voltages higher than the pre-verify voltage PVp. For example, the pre-program loop LOOP_P includes a step (ST30) of increasing the threshold voltages of the memory cells, using set first bit line voltages and a program voltage Vpgm, and a step (ST40) of performing a pre-verify operation.

In the step ST30, the first bit line voltages may be set to have the same level or to have different levels depending on separation distances of channel structures.

During the pre-verify operation (ST40), it is determined whether the threshold voltages Vth of the memory cells connected to the selected word line are higher than the pre-verify voltage PVp, by applying the pre-verify voltage PVp to the selected word line.

As a result obtained by performing the pre-verify operation (ST40), when a memory cell has a threshold voltage that is no more than the pre-verify voltage PVp (No), the program voltage Vpgm is increased by a step voltage in step ST50. Subsequently, the steps ST30 and ST40 are repeatedly performed by applying the increased program voltage Vpgm to the selected word line.

As a result obtained by performing the pre-verify operation (ST40), when the memory cell is a pre-programmed cell having a threshold voltage higher than the pre-verify voltage PVp among the memory cells (Yes), a main program loop LOOP_M is performed.

The main program loop LOOP_M is performed such that the pre-programmed cell having a threshold voltage higher than the pre-verify voltage PVp has a threshold voltage higher than the main verify voltage PVm. To this end, the main program loop LOOP_M includes a step (ST60) of increasing the threshold voltages of the memory cells, using set second bit line voltages and the program voltage Vpgm, and a step (ST70) of performing a main verify operation.

In the step ST60, the second bit line voltages may be set to have the same level or to have different levels depending on separation distances of the channel structures.

During the main verify operation (ST70), it is determined whether the threshold voltages Vth of the memory cells connected to the selected word line are higher than the main verify voltage PVm, by applying the main verify voltage PVm to the selected word line.

As a result obtained by performing the main verify operation (ST70), when a memory cell has a threshold voltage that is no more than the main verify voltage PVm (No), the program voltage Vpgm is increased by a step voltage in step S80. Subsequently, the steps ST60 and ST70 are repeatedly performed by applying the increased program voltage Vpgm to the selected word line.

As a result obtained by performing the main verify operation (ST70), when the memory cell is a programmed cell having a threshold voltage higher than the main verify voltage PVm among the memory cells (Yes), a program inhibit voltage Vinh is applied to a program inhibit bit line connected to the programmed memory cell among the bit lines in step ST90.

The pre-program loop LOOP_P and the main program loop LOOP_M are repeated within a limited number of times until threshold voltages of cells to be programmed, which are connected to the selected word line, become higher than the main verify voltage PVm, and then the program operation is ended.

The first bit line voltages are set lower than the program inhibit voltage Vinh. The second bit line voltages may be program suppression voltages that are set higher than the first bit line voltages and are set lower than the program inhibit voltage Vinh. Accordingly, an increment in threshold voltage of the selected memory cell in the main program loop LOOP_M may be decreased as compared with that in threshold voltage of the selected memory cell in the pre-program loop LOOP_P. Accordingly, the width of a threshold voltage distribution of memory cells may be prevented from being widened.

In an embodiment of the first bit line voltages may be set higher when the channel structures become closer to the edge of the selected word line, and the second bit line voltages may be set to have the same level.

In an embodiment, the first bit line voltages may be set to have the same level, and the second bit line voltages may be set higher when the channel structures become closer to the edge of the selected word line.

In an embodiment, the first bit line voltages may be set higher when the channel structures become closer to the edge of the selected word line, and the second bit line voltages may be set higher when the channel structures become closer to the edge of the selected word line.

Figure 11A:
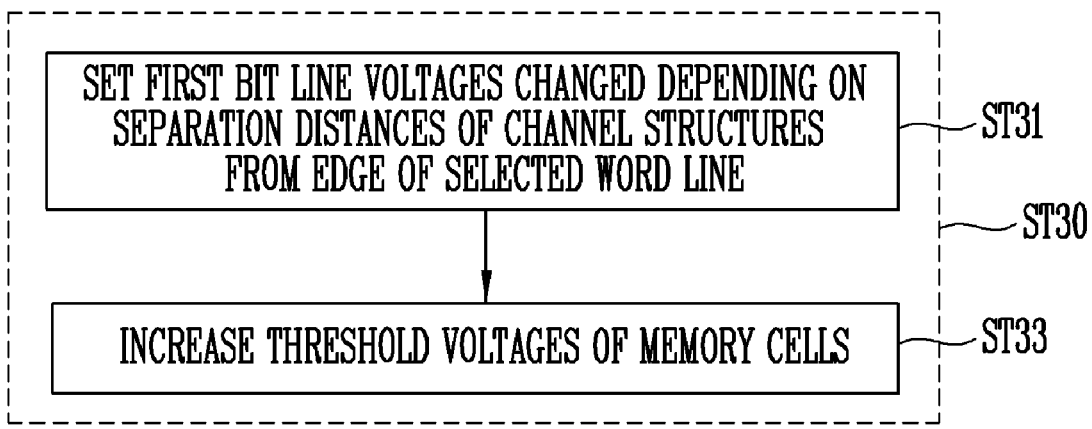
FIGS. 11A and 11B are diagrams respectively illustrating embodiments of steps shown in FIG. 10B.
Figure 11B:
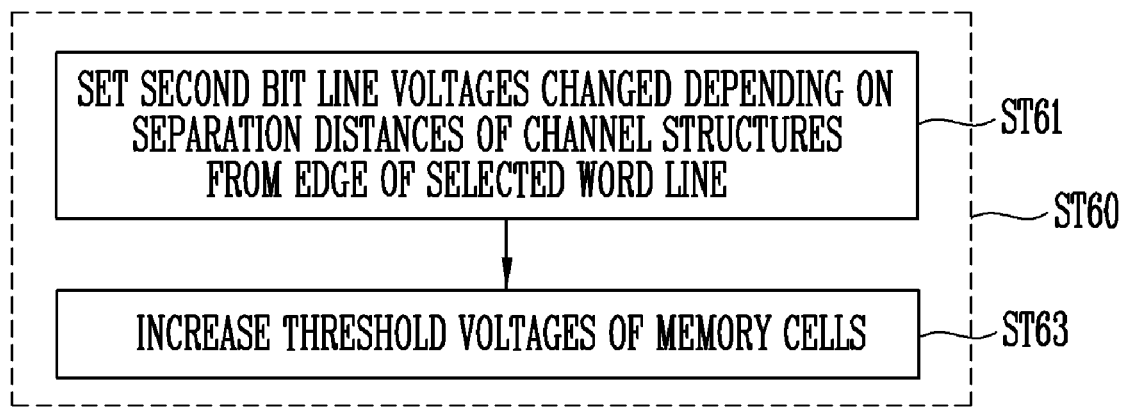

FIGS. 11A and 11B are diagrams respectively illustrating embodiments of the steps ST30 and ST60 shown in FIG. 10B. FIG. 11A is a flowchart illustrating an embodiment of the step ST30, and FIG. 11B is a flowchart illustrating an embodiment of the step ST60.

Referring to FIG. 11A, the step ST30 may include a step (ST31) of setting the first bit line voltages and a step (ST33) of increasing the threshold voltages of the memory cells, using the set first bit line voltages.

In the step ST31, the semiconductor memory device may set the first bit line voltages to be different from each other depending on separation distances of the channel structures from the edge of the word line. In an embodiment, the first bit line voltages may be set higher when the channel structures become closer to the edge of the selected word line. For example, as described with reference to FIG. 7, the channel structures may be divided into a first channel group adjacent to the edge of the word line and the other second channel group. The bit lines may be divided into a first bit line connected to the first channel group and a second bit line connected to the second channel group. In the step ST31, a first bit line voltage having a first level may be applied to the first bit line, and the first bit line voltage having a second level may be applied to the second bit line. The second level may be set lower than the first level. The first bit line voltage having the first level may be a program suppression voltage. The first bit line voltage having the second level may be a program allow voltage.

Referring to FIG. 11B, the step ST60 may include a step (ST61) of setting the second bit line voltages and a step (ST63) of increasing the threshold voltages of the memory cells, using the set second bit line voltages.

In the step ST61, the semiconductor memory device may set the second bit line voltages to be different from each other depending on separation distances of the channel structures from the edge of the word line. In an embodiment, the second bit line voltages may be set higher when the channel structures become closer to the edge of the selected word line. For example, as described with reference to FIG. 7, the channel structures may be divided into a first channel group adjacent to the edge of the word line and the other second channel group. The bit lines may be divided into a first bit line connected to the first channel group and a second bit line connected to the second channel group. In the step ST63, a second bit line voltage having a third level may be applied to the first bit line, and the second bit line voltage having a fourth level may be applied to the second bit line. The fourth level may be set lower than the third level. The second bit line voltage having the third level and the second bit line voltage having the fourth level may be program suppression voltages.

Figure 12:
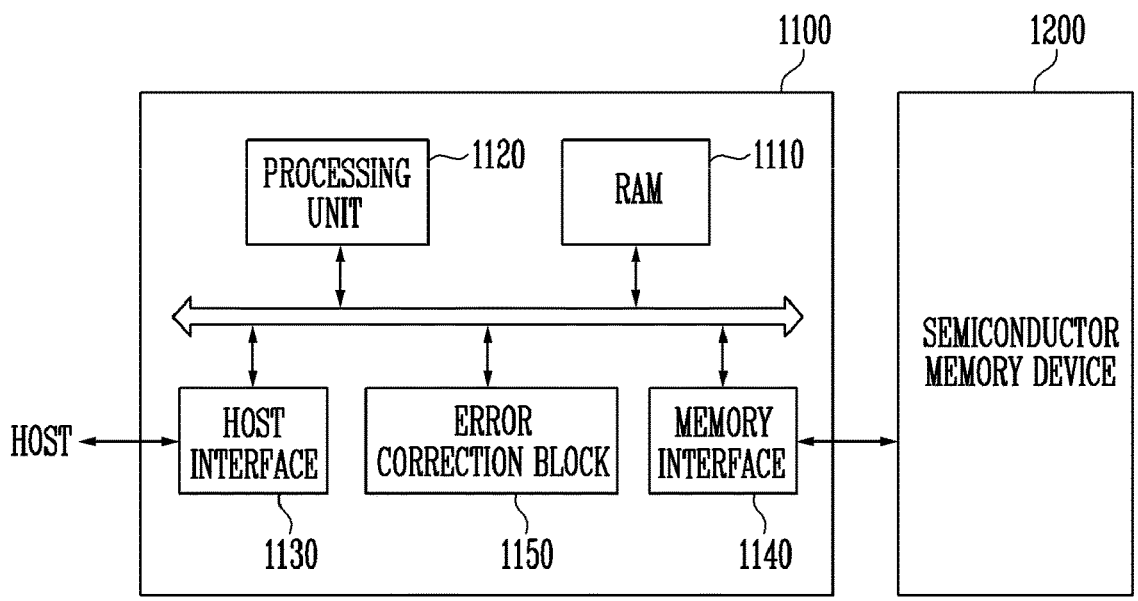
FIGS. 12 and 13 are block diagrams illustrating memory systems according to embodiments of the present disclosure.
Figure 13:
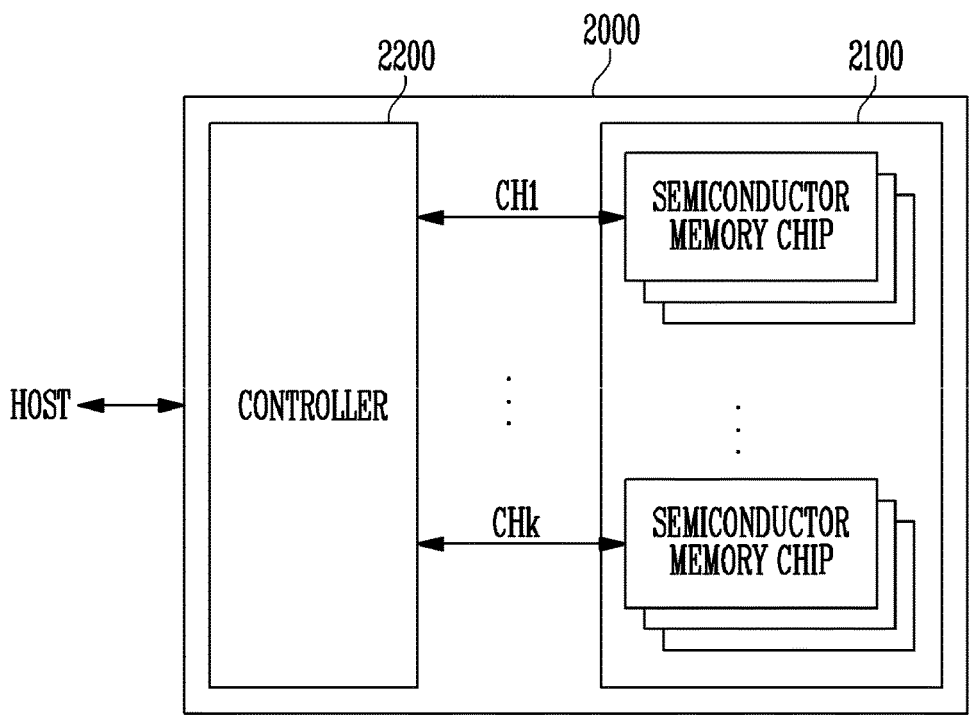

FIGS. 12 and 13 are block diagrams illustrating memory systems according to embodiments.

Referring to FIG. 12, the memory system 1000 includes the semiconductor memory device 1200 and a controller 1100. The semiconductor memory device 1200 may be the semiconductor memory devices 50 described with reference to FIG. 2. Hereinafter, overlapping descriptions will be omitted.

The controller 1100 is connected to a host and the semiconductor memory device 1200. The controller 1100 is configured to access the semiconductor memory device 1200 in response to a request from the host. For example, the controller 1100 controls a read operation, a program operation, an erase operation, an error detection & correction operation, and a background operation of the semiconductor memory device 1200.

The controller 1100 is configured to provide an interface between the semiconductor memory device 1200 and the host. The controller 1100 drives firmware for controlling the semiconductor memory device 1200.

The controller 1100 includes a random access memory (RAM) 1110, a processing unit 1120, a host interface 1130, a memory interface 1140, and an error correction block 1150.

The RAM 1110 is used as at least one of a working memory of the processing unit 1120, a cache memory between the semiconductor memory device 1200 and the host, and a buffer memory between the semiconductor memory device 1200 and the host. The processing unit 1120 controls overall operations of the controller 1100. In addition, the controller 1100 may temporarily store program data provided from the host in a program operation.

The host interface 1130 includes a protocol for exchanging data between the host and the controller 1100. The protocol may be implemented with at least one of the interface protocols described with reference to FIGS. 8A and 8B.

The memory interface 1140 interfaces with the semiconductor memory device 1200. For example, the memory interface 1140 may include a NAND interface or a NOR interface.

The error correction block 1150 detects and corrects an error of data received from the semiconductor memory device 1200 by using an error correction code (ECC). The processing unit 1120 may control the semiconductor memory device 1200 to adjust a read voltage, based on an error detection result of the error correction block 1150, and to perform re-reading. In an embodiment, the error correction block 1150 may be provided as a component of the controller 1100.

The controller 1100 and the semiconductor memory device 1200 may be integrated as one semiconductor device. In an embodiment, the controller 1100 and the semiconductor memory device 1200 may be integrated as one semiconductor device, to constitute a memory card. For example, the controller 1100 and the semiconductor memory device 1200 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the semiconductor memory device 1200 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host connected to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 1200 or the memory system 1000 may be packaged in various forms. For example, the semiconductor memory device 1200 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Referring to FIG. 13, the memory system 2000 includes a semiconductor memory device 2100 and a controller 2200. The semiconductor memory device 2100 includes a plurality of semiconductor memory chips. The plurality of semiconductor memory chips are divided into a plurality of groups.

The plurality of groups may communicate with the controller 2200 through first to kth channels CH1 to CHk. Each semiconductor memory chip may be configured and operated identically to the semiconductor memory devices 50 described with reference to FIG. 2.

Each group communicates with the controller 2200 through one common channel. The controller 2200 is configured identically to the controller 1100 described with reference to FIG. 12. The controller 2200 controls the plurality of memory chips of the semiconductor memory device 2100 through the plurality of channels CH1 to CHk.

Figure 14:
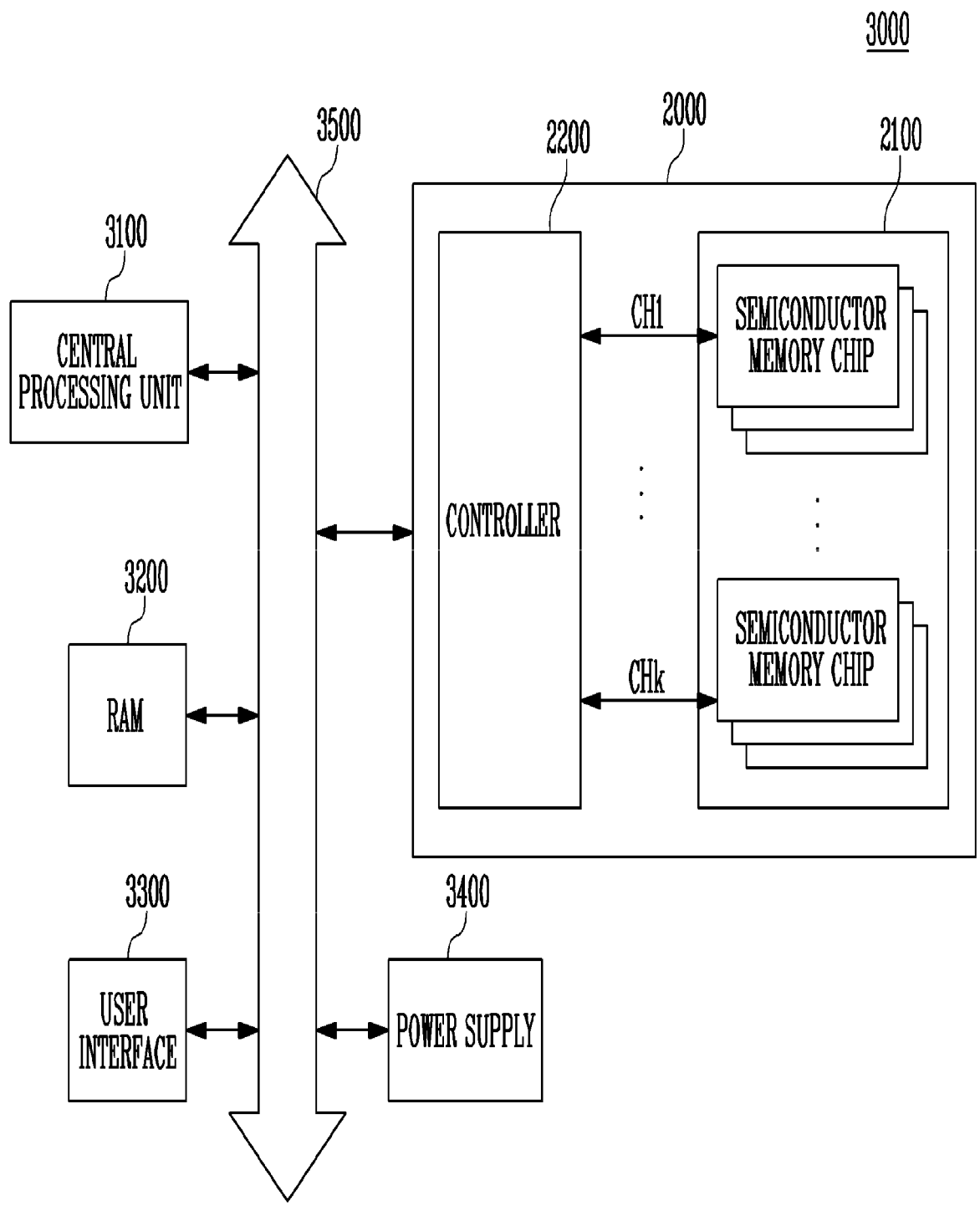
FIG. 14 is a block diagram illustrating a computing system according to an embodiment of the present disclosure.

FIG. 14 is a block diagram illustrating a computing system according to an embodiment.

Referring to FIG. 14, the computing system 3000 includes a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

The semiconductor memory device 2100 is connected to the system bus 3500 through the controller 2200. Alternatively, the semiconductor memory device 2100 may be directly connected to the system bus 3500. The function of the controller 2200 may be performed by the central processing unit 3100 and the RAM 3200.

FIG. 14 illustrates the computing system 3000 including the memory system 2000 described with reference to FIG. 13. However, the embodiments of the present disclosure are not limited thereto. For example, the memory system 2000 of the computing system 3000 may be replaced with the memory system 1000 described with reference to FIG. 12. In an embodiment, the computing system 3000 may include both the memory systems 1000 and 2000 described with reference to FIGS. 12 and 13.

The embodiments of the present disclosure have been described in the drawings and specification. Although specific terminologies are used here, those are to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method for operating a memory device, the method comprising:
   programming memory cells connected to a selected word line among word lines that are stacked to be spaced apart from each other and are penetrated by channel structures,
   wherein, while the memory cells connected to the selected word line are being programmed, bit line voltages set to be different from each other depending on separation distances of the channel structures from an edge of the selected word line are applied to bit lines connected to the channel structures.

2. The method of claim 1, wherein the bit line voltages are set higher when the channel structures become closer to the edge of the selected word line.

3. The method of claim 1, wherein the channel structures are divided into a first channel group adjacent to the edge of the selected word line and a second channel group spaced apart from the edge of the selected word line with the first channel group interposed between the second channel group and the edge of the selected word line,
   wherein the bit lines are divided into a first bit line connected to the first channel group and a second bit line connected to the second channel group,
   wherein, while the memory cells connected to the selected word line are being programmed, the bit line voltages are set to a first level applied to the first bit line and a second level that is applied to the second bit line and is lower than the first level.

4. The method of claim 1, wherein the programming of the memory cells connected to the selected word line comprises:
   increasing threshold voltages of the memory cells connected to the selected word line by applying the bit line voltages to the bit lines and applying a program voltage to the selected word line; and
   performing a verify operation of determining whether the threshold voltages of the memory cells connected to the selected word line are higher than a verify voltage, by applying the verify voltage to the selected word line.

5. The method of claim 4, wherein the programming of the memory cells connected to the selected word line comprises:
   applying a program inhibit voltage to a program inhibit bit line connected to a programmed cell having a threshold voltage higher than the verify voltage among the bit lines.

6. The method of claim 5, wherein the bit line voltages are set lower than the program inhibit voltage.

7. A method for operating a memory device, the method comprising:
   performing a pre-program loop such that memory cells connected to a selected word line among word lines that are stacked to be spaced apart from each other and are penetrated by channel structures have threshold voltages higher than a pre-verify voltage; and
   performing a main program loop such that pre-programmed cells having threshold voltages higher than the pre-verify voltage among the memory cells have threshold voltages higher than a main verify voltage,
   wherein, while at least one of the pre-program loop and the main program loop is being performed, bit line voltages set to be different from each other depending on separation distances of the channel structures from an edge of the selected word line are applied to bit lines connected to the channel structures.

8. The method of claim 7, wherein the bit line voltages are set higher when the channel structures become closer to the edge of the selected word line.

9. The method of claim 7, wherein the performing of the pre-program loop comprises:
   increasing the threshold voltages of the memory cells connected to the selected word line by applying first bit line voltages to the bit lines and applying a program voltage to the selected word line; and
   performing a pre-verify operation of determining whether the threshold voltages of the memory cells are higher than the pre-verify voltage, by applying the pre-verify voltage to the selected word line.

10. The method of claim 9, wherein the first bit line voltages are set higher when the channel structures become closer to the edge of the selected word line.

11. The method of claim 9, further comprising applying a program inhibit voltage to a program inhibit bit line, which is connected to a programmed memory cell having a threshold voltage higher than the main verify voltage, among the bit lines,
   wherein the first bit line voltages are set lower than the program inhibit voltage.

12. The method of claim 9, wherein the channel structures are divided into a first channel group adjacent to the edge of the selected word line and a second channel group spaced apart from the edge of the selected word line with the first channel group interposed between the second channel group and the edge of the selected word line,
   wherein the bit lines are divided into a first bit line connected to the first channel group and a second bit line connected to the second channel group,
   wherein, while the pre-program loop is being performed, the bit line voltages are set to a first level applied to the first bit line and a second level that is applied to the second bit line and is lower than the first level.

13. The method of claim 9, wherein the performing of the main program loop comprises:
   increasing threshold voltages of pre-programmed cells having threshold voltages higher than the pre-verify voltage by applying second bit line voltages higher than the first bit line voltages to the bit lines and applying the program voltage to the selected word line; and performing a main verify operation of determining whether the threshold voltages of the memory cells connected to the selected word line are higher than the main verify voltage, by applying the main verify voltage to the selected word line.

14. The method of claim 13, wherein the second bit line voltages are set higher when the channel structures become closer to the edge of the selected word line.

15. The method of claim 13, wherein the channel structures are divided into a first channel group adjacent to the edge of the selected word line and a second channel group spaced apart from the edge of the selected word line with the first channel group interposed between the second channel group and the edge of the selected word line,
wherein the bit lines are divided into a first bit line connected to the first channel group and a second bit line connected to the second channel group,
wherein, while the main program loop is being performed, the bit line voltages are set to a third level applied to the first bit line and a fourth level that is applied to the second bit line and is lower than the third level.

16. The method of claim 15, further comprising applying a program inhibit voltage to a program inhibit bit line connected to a programmed cell having a threshold voltage higher than the main verify voltage among the bit lines,
wherein the second bit line voltages are set lower than the program inhibit voltage.

17. A memory device comprising:
a memory cell array comprising word lines that are stacked to be spaced apart from each other and are penetrated by channel structures, memory cells connected to the word lines, and bit lines connected to the channel structures; and
a peripheral circuit configured to set bit line voltages applied to the bit lines to be different from each other depending on separation distances of the channel structures from edges of the word lines when a program operation is performed on the memory cell array.

18. The memory device of claim 17, wherein the peripheral circuit comprises a control logic configured to, when the program operation is performed on the memory cell array, control the bit line voltages to be higher when the channel structures become closer to the edges of the word lines.

19. The memory device of claim 17, wherein the channel structures are divided into a first channel group adjacent to the edges of the word lines and a second channel group spaced apart from the edges of the word lines with the first channel group interposed between the second channel group and the edges of the word lines,
wherein the bit lines are divided into a first bit line connected to the first channel group and a second bit line connected to the second channel group,
wherein the peripheral circuit comprises a control logic configured to control the bit line voltages to be set to a first level applied to the first bit line and a second level that is applied to the second bit line and is lower than the first level.

20. The memory device of claim 17, wherein the peripheral circuit:
applies a program inhibit voltage to a program inhibit bit line connected to a programmed cell having a threshold voltage higher than a verify voltage among the bit lines; and
when the program operation is performed on the memory cell array, applies the bit line voltages having levels lower than that of the program inhibit voltage to the bit lines.

21. The memory device of claim 17, wherein the peripheral circuit:
controls a program operation on the memory cell array such that to perform a pre-program loop such that the memory cells have threshold voltages higher than a pre-verify voltage and then perform a main program loop such that pre-programmed cells having threshold voltages higher than the pre-verify voltage have threshold voltages higher than main verify voltage; and
while at least one of the pre-program loop and the main program loop is being performed, controls the bit line voltages applied to the channel structures to be higher when the channel structures become closer to an edge of a selected word line among the word lines.

* * * * *